United States Patent [19]

Sano et al.

[11] Patent Number: 5,719,066
[45] Date of Patent: Feb. 17, 1998

[54] METHOD OF MANUFACTURING A SEMICONDUCTOR INTEGRATED CIRCUIT APPARATUS HAVING A MIS-TYPE CONDENSER

[75] Inventors: Yoshiaki Sano; Toshimasa Sadakata; Yasunari Tagami; Yasuo Oishibashi, all of Moriguchi, Japan

[73] Assignee: Sanyo Electric Co., Ltd., Osaka, Japan

[21] Appl. No.: 625,284

[22] Filed: Apr. 1, 1996

[30] Foreign Application Priority Data

Mar. 30, 1995 [JP] Japan .................................. 7-073993
Mar. 30, 1995 [JP] Japan .................................. 7-073994

[51] Int. Cl.$^6$ ................................................. H01L 21/265
[52] U.S. Cl. ..................... 437/31; 437/47; 437/60; 437/919; 437/51
[58] Field of Search ........................ 437/47, 60, 919, 437/34, 51, 31; 148/DIG. 14

[56] References Cited

U.S. PATENT DOCUMENTS

| | | | |
|---|---|---|---|
| 4,001,869 | 1/1977 | Brown | 437/60 |
| 4,377,029 | 3/1983 | Ozawa | 437/60 |
| 4,717,680 | 1/1988 | Piotrowski | 437/60 |
| 4,805,071 | 2/1989 | Hutter et al. | 437/60 |
| 4,898,839 | 2/1990 | Fujinuma et al. | 437/60 |

FOREIGN PATENT DOCUMENTS 61-13656  1/1986  Japan .
62-163356 7/1987  Japan .

*Primary Examiner*—Tuan H. Nguyen
*Attorney, Agent, or Firm*—Loeb & Loeb LLP

[57] ABSTRACT

A lower layer diffusion layer of a metal-insulator-semiconductor-type (MIS-type) condenser is formed by implanting and diffusing phosphorus into an upper portion of an epitaxial layer formed on a semiconductor substrate. Thereafter, a silicon nitride film functioning as a dielectric film of the MIS type condenser is formed on the lower layer diffusion layer, and a poly-silicon film functioning as a protective film for the silicon nitride film is formed on the silicon nitride film in succession to the formation of the silicon nitride film without performing any etching operation. The formation of the silicon nitride film and the poly-silicon film is performed according to a vacuum chemical vapor deposition in the same chamber to prevent the silicon nitride film from being exposed to oxygen. Thereafter, the silicon nitride film and the poly-silicon film are baked to form an oxidized film surrounding the silicon nitride film and the poly-silicon film. Thereafter, a metal is deposited on the poly-silicon film to form an upper electrode of the MIS type condenser. Therefore, the deterioration of dielectric characteristics of the MIS type condenser can be prevented.

8 Claims, 20 Drawing Sheets

METHOD OF MANUFACTURING A SEMICONDUCTOR INTEGRATED CIRCUIT APPARATUS HAVING A MIS-TYPE CONDENSER

BACKGROUND OF THE INVENTION

1. Field of the Invention

The present invention relates to a metal-insulator-semiconductor-type condenser, a semiconductor integrated circuit apparatus having the condenser, a manufacturing method of the condenser and a manufacturing method of the apparatus.

2. Description of the Prior Art

An example of a semiconductor integrated circuit in which a plurality of transistors and metal-insulator-semiconductor-(MIS-type) condensers are integrated is disclosed in a Published Unexamined Japanese Patent Application No. 163356 of 1987 (S62-163356).

FIGS. 1 to 3 are cross-sectional views showing a manufacturing method of a conventional MIS-type condenser disclosed in the Japanese Patent Application.

As shown in FIG. 1, an n-type epitaxial layer 2 is formed on a p-type semiconductor substrate 1, all upper surface of the n-type epitaxial layer 2 is covered with an insulating film 3 made of an oxidized film or the like, an island region 5 is surrounded by a p$^+$-type separating region 4 placed on the semiconductor substrate 1, and an n$^+$-type buried layer 6 is placed between the semiconductor substrate 1 and the epitaxial layer 2. Also, an n$^+$-type lower layer diffused region 7 is diffused in a portion of the island region 5 placed just under an open hole of the insulating film 3, and an Si nitride film 8 is formed on the insulating film 3 to cover the open hole of the insulating film 3. The lower layer diffused region 7 functions as a lower layer electrode for a conventional MIS-type condenser. The Si nitride film 8 functions as a dielectric film for the conventional MIS-type condenser.

A film thickness of the Si nitride film 8 is adjusted according to an etching technique, and a wet oxidation is performed for the Si nitride film 8 at a temperature of 1100° C. for ten minutes. In this oxidation process, excessive Si which is not perfectly connected to N is oxidized. Also, Si which is exposed to a pinhole formed on the surface of the Si nitride film 8 is simultaneously oxidized, the pinhole is buried with the oxidized Si, and the surface of the Si nitride film 8 is flattened. As a result of the oxidation process, an Si oxidation film 9 grows on the surface of the Si nitride film 8 at a thickness of 40 angstroms.

Thereafter, as shown in FIG. 2, the upper surface of the Si oxidation film 9 is covered with a poly-Si 10. Thereafter, as shown in FIG. 3, the Si nitride film 8, the Si oxidation film 9 and the poly-Si 10 are patterned according to a reactive ion etching technique or a chemical dry etching technique.

Thereafter, the following processes (not shown) are performed. In cases where a bipolar transistor is formed with the conventional MIS-type condenser by implanting an impurity such as boron (B) into another region, the boron is also implanted into the poly-Si 100 so that a resistance value of the poly-Si 10 is decreased. Also, a metal layer made of Al or the like is formed on the poly-Si 10 as an upper electrode of the conventional MIS-type condenser. Because of the implantation of the impurity into the poly-Si 10, a contact resistance between the poly-Si 10 and the upper electrode is decreased.

In the above manufacturing processes, the conventional MIS-type condenser is manufactured. The conventional MIS-type condenser is used for a CR circuit or the like of an integrated circuit, so that a high capacitance ranging from 2000 to 4000 pF is required for the conventional MIS-type condenser. Also, the dielectric film (or the Si nitride film 8) of the conventional MIS-type condenser has a film thickness of 900 angstroms. Though the integrated circuit is downsizing year after year and an integrated density of circuits is increasing, because the dielectric film is too thick, there is a drawback that an area occupied by the conventional MIS-type condenser becomes large in cases where the high capacitance ranging from 2000 to 4000 pF is required for the conventional MIS-type condenser.

Therefore, because a capacitance value of the conventional MIS-type condenser is increased when a film thickness of the dielectric film is decreased, the film thickness of the dielectric film has been recently decreased to about 400 angstroms which is almost half of 900 angstroms. The film thickness of the dielectric film shown in the Japanese Patent Application No. 163356 of 1987 is 500 angstroms.

Also, because the dielectric film is thinned, a superior resist-voltage characteristic is required for the Si nitride film 8. In general, a superior Si nitride having a thickness of 400 angstroms resists an applied voltage of about 30 V. Also, because a voltage of an electric source used for the integrated circuit is generally 15 V, a voltage applied to the conventional MIS-type condenser is not more than 15 V. Therefore, in cases where a superior Si nitride film is formed in the conventional MIS-type condenser, the film thickness of the Si nitride film 8 can be decreased to 400 angstroms. However, an area of the Si nitride film 8 is still wide even though the film thickness of the Si nitride film 8 is decreased to 400 angstroms, and a ratio of the area of the Si nitride film 8 to all area of an integrated circuit ranges from 15 to 20%. Therefore, there is a high probability that a defect or the like occurs in the wide dielectric film and a defective condenser is manufactured.

To find out the cause of the defect occurring in the wide dielectric film, the conventional MIS-type condenser is experimentally manufactured by the inventors to judge whether or not a superior Si nitride is formed in the conventional MIS-type condenser as the Si nitride film 8. In detail, a Si nitride film having a film thickness of 400 angstroms is deposited on an opening hole of an oxidized film (or an insulating film) placed on a Si wafer (or a substrate) according to a chemical vapor depositing technique, an Al electrode is formed on the Si nitride film, so that an experimental MIS-type condenser is manufactured. Thereafter, a resist-voltage characteristic of the experimental MIS-type condenser is measured, and it is judged that there is no defect in a resist-voltage performance of the Si nitride film. Therefore, a superior Si nitride film is formed in the experimental MIS-type condenser as the dielectric film 8 according to the chemical vapor deposition technique. However, after the formation of the Si nitride film 8, the Si nitride film 8 is heated and immersed into an etching liquid. Therefore, it is proved that the resist-voltage characteristic of the Si nitride film 8 is degraded in various processes performed after the formation of the Si nitride film 8.

In the conventional manufacturing processes shown in FIGS. 1 to 3, because a non-reacted Si substance not reacted with nitrogen (N) and an intermediate product not perfectly reacted with the nitrogen exist, the non-reacted Si substance and the intermediate product are positively oxidized to change the non-reacted Si substance and the intermediate product to an insulating substance for the purpose of preventing an electric short and the deterioration of the characteristics of the Si nitride film 8.

However, in cases where an etching process is performed for the Si nitride film 8 prior to the oxidation of the Si nitride film 8, the non-reacted Si substance is etched and one or more pinholes are produced in the Si nitride film 8. Therefore, an electric short or the deterioration of the resist-voltage characteristic occur in the Si nitride film 8. Also, even though the Si nitride film 8 is heated and oxidized after the etching process, it is experimentally proved that the pinholes are not buried. Also, it is experimentally proved that the etching process and the thermal oxidation process for the conventional MIS-type condenser adversely influence the characteristics of the conventional MIS-type condenser.

Also, Si and Si—O—N exist in the Si nitride film 8 as the intermediate product. A weak spot, such as the Si, the Si—O—N or a micro-crack, spreads in the Si nitride film 8, the Si nitride film 8 is unusually oxidized in an oxygen atmosphere, and an unusually oxidized weak spot is removed in the etching process. Therefore, a defect of the Si nitride film 8 occurs in a position at which the unusually oxidized weak spot is removed. The reason that the intermediate production Si and Si—O—N unusually oxidized is removed in the etching process is as follows. The intermediate product Si is changed to $SiO_2$ and the intermediate product Si—O—N is changed to $SiO_2$ and SiN in the oxidation process. Because the product $SiO_2$ and SiN differs from materials of the Si nitride film 8, a weak spot structurally weakened by the product $SiO_2$ and SiN is enlarged, and a dielectric characteristic (or resist-voltage characteristic) of the Si nitride film 8 is degraded.

In the conventional MIS-type condenser, because the Si nitride film 8 is covered with the poly-Si film 10, it seems that the Si nitride film 8 is perfectly protected by the poly-Si film 10. However, when the Si nitride film 8 is etched to adjust a film thickness of the Si nitride film 8 after the formation of the Si nitride film 8, the weak spot structurally weakened is easily removed. For example, the intermediate product of the Si nitride film 8 is easily removed by hydrofluoric acid. Because the weak spot structurally weakened is easily removed, a large pinhole is formed. Therefore, even though the oxidation of the Si nitride film 8 is performed to bury the large pinhole with the oxidized film, there is a case that the pinhole is not perfectly buried because the size of the pinhole is large. Also, there is a case that the weak spot structurally weakened is not sufficiently oxidized because the pinhole is small. Therefore, a large number of weak spots are scattered in the Si nitride film 8, an electric short occurs between the poly-Si film 10 formed in the upper layer by a conductive material and the lower layer diffusion region 7, and a film quality of the Si nitride film 8 is degraded.

Also, in another process (not shown), a Si oxidized film is formed on the Si nitride film 8 according to the chemical vapor deposition in place of the poly-Si film 10, and the Si oxidized film is removed to make a plurality of contact holes for an emitter, a base and a collector of a transistor. In this case, though the Si nitride film 8 is protected by the Si oxidized film, it is required to perfectly remove the Si oxidized film for preventing a capacitance value of the conventional MIS-type condenser from being lowered. Therefore, not only the Si oxidized film is removed but also the Si nitride film 8 is etched by an over-etching. That is, the Si nitride film 8 is exposed to an etching gas or an etching liquid, the weak spot structurally weakened is positively etched, and the characteristics of the Si nitride film 8 such as a resist-voltage characteristic are degraded.

Therefore, the etching process or the thermal oxidation process performed to change Si of the Si nitride film 8 to an insulating substance does not improve the characteristics of the Si nitride film 8, but the characteristics of the Si nitride film 8 are degraded.

Also, because the intermediate product such as Si and Si—O—N is unusually oxidized in the thermal oxidation process and an unusually oxidized weak spot is removed in the etching process, the weak spot is enlarged, and a pinhole is produced in the etching process.

In addition, though a resistance value of the poly-Si film 10 is decreased by implanting an impurity into the poly-Si film 10 while implanting the impurity, for example, into a base region of a transistor, because the Si nitride film 8 is thermally processed in a base diffusing process and an emitter diffusing process performed for the manufacturing of the transistor, the Si nitride film 8 is degraded, the resistance value of the poly-Si film 10 is increased, the control of a grounded emitter forward current amplification factor $h_{FE}$ becomes difficult.

SUMMARY OF THE INVENTION

An object of the present invention is to provide a metal-insulator-semiconductor-type condenser in which the deterioration of a Si nitride film functioning as a dielectric film is prevented in order to improve characteristics of the condenser, a semiconductor integrated circuit apparatus having the condenser, a manufacturing method of the condenser and a manufacturing method of the apparatus.

In a metal-insulator-semiconductor-type condenser according to the present invention, the metal-insulator semiconductor-type condenser comprises a semiconductor layer, a diffused layer, a silicon nitride film, and a poly-silicon layer arranged on the silicon nitride film. An impurity is implanted into the poly-silicon layer.

Therefore, because the surface of the silicon nitride film is covered with the poly-silicon layer in a manufacturing step, the silicon nitride film is protected. That is, because the surface of the silicon nitride film is not exposed to any etchant or oxygen in an oxygenic atmosphere, the deterioration of the silicon nitride film can be prevented.

It is preferred that a film thickness of the poly-silicon layer range from 1500 Å to 2500 Å on condition that a voltage proof of the metal insulator semiconductor type condenser is equal to or less than 30 V.

In conventional cases where the poly-silicon layer is excessively thinned, an electric short occurs between upper and lower electrodes of the metal-insulator-semiconductor-type condenser, so that the metal insulator semiconductor type condenser does not function as a condenser. In contrast, in conventional cases where the poly-silicon layer is excessively thickened, even though the impurity is implanted into the poly-silicon layer, because a density of the impurity in the poly-silicon layer is lowered, the poly-silicon layer functions as a condenser, so that a capacitance value of the metal-insulator semiconductor-type condenser is undesirably decreased. However, in the present invention, because a film thickness of the poly-silicon layer ranges from 1500 Å to 2500 Å on condition that a voltage proof of the metal-insulator semiconductor-type condenser is equal to or less than 30 V, the electric short between upper and lower electrodes of the metal-insulator-semiconductor-type condenser and the undesirable decrease of the capacitance value in the metal-insulator-semiconductor-type condenser can be prevented.

In a semiconductor integrated circuit apparatus according to the present invention, the semiconductor integrated circuit apparatus comprises a metal-insulator-semiconductor-type condenser and a bipolar transistor arranged on the same substrate, the metal-insulator-semiconductor-type condenser comprises a semiconductor layer, a diffused layer, a silicon nitride film, and a poly-silicon layer arranged on the silicon nitride film. A first impurity is implanted into the poly-silicon layer. The bipolar transistor comprises a collector region arranged in a semiconductor layer, a base region, and an emitter region arranged on the base region. The first impurity is implanted into the base region.

Therefore, because the surface of the silicon nitride film is covered with the poly-silicon layer in a manufacturing step, the silicon nitride film is protected. That is, because the surface of the silicon nitride film is not exposed to any etchant or oxygen in an oxygenic atmosphere, the deterioration of the silicon nitride film can be prevented.

Also, because the first impurity implanted into the poly-silicon layer is the same as that implanted into the emitter region, the first impurity can be simultaneously implanted into the poly-silicon layer and the emitter region in the same manufacturing step.

It is preferred that a film thickness of the poly-silicon layer range from 1500 Å to 2500 Å on condition that a voltage proof of the metal insulator semiconductor type condenser is equal to or less than 30 V.

Therefore, in cases where a voltage proof of the metal-insulator-semiconductor-type condenser is equal to or less than 30 V, the electric short occurring between upper and lower electrodes of the metal-insulator-semiconductor-type condenser because the poly-silicon layer is excessively thinned and the undesirable decrease of the capacitance value occurring in the metal-insulator-semiconductor-type condenser because the poly-silicon layer is excessively thickened can be prevented.

In a manufacturing method of the metal-insulator-semiconductor-type condenser according to the present invention, a poly-silicon layer is formed in succession to the formation of a silicon nitride film used as a dielectric layer of the metal-insulator-semiconductor-type condenser. Therefore, because the surface of the silicon nitride film is covered with the poly-silicon layer, the silicon nitride film is protected. That is, because the surface of the silicon nitride film is not exposed to any etchant or oxygen in an oxygenic atmosphere, the deterioration of the silicon nitride film can be prevented.

It is preferred that the poly-silicon layer be formed according to a chemical vapor deposition in the same manufacturing apparatus as that in which the silicon nitride film is formed and the silicon nitride film not be exposed to oxygen during the formation of the poly-silicon layer.

Therefore, in a conventional manufacturing method, a substrate on which a silicon nitride film is formed is taken out from a silicon nitride film-forming apparatus, the silicon nitride film is exposed to oxygen in an oxygenic atmosphere when the substrate is put in a poly-silicon-forming apparatus, and the surface of the silicon nitride film is degraded. However, in the present invention, because the poly-silicon layer is formed in the same manufacturing apparatus as that in which the silicon nitride film is formed, the deterioration of the silicon nitride film can be prevented.

It is preferred that photoresist be selectively formed on peripheries of the poly-silicon layer and the silicon nitride film, a second insulating film be etched while using the photoresist as a mask, and a region not placed in any periphery of the poly-silicon layer or the silicon nitride film remaining in the condenser be exposed.

In a conventional manufacturing method, in cases where a forming region of the photoresist is not placed at a correct position because an exposing light is not correctly positioned, an opening area of the photoresist is shifted from a forming region of the poly-silicon layer and the silicon nitride film, the opening area of the photoresist is placed on another important layer, and the important area placed under the opening area of the photoresist is erroneously removed in an etching process. However, in the present invention, because photoresist may be selectively formed on peripheries of the poly-silicon layer and the silicon nitride film, there is no probability that the important area is erroneously removed in an etching process.

It is preferred that a silicon nitride film used as a dielectric layer of the metal-insulator-semiconductor-type condenser be formed on a first insulating film and a poly-silicon film be formed in succession to the formation of the silicon nitride film.

Therefore, because the surface of the silicon nitride film is covered with the poly-silicon layer, the silicon nitride film is protected. That is, because the surface of the silicon nitride film is not exposed to any etchant or oxygen in an oxygenic atmosphere, the deterioration of the silicon nitride film can be prevented.

In addition to the above manufacturing method, it is preferred that the poly-silicon layer and the silicon nitride film be patterned on condition that a patterned poly-silicon layer and a patterned silicon nitride film remain on a diffused layer, a second insulating film be formed on the first insulating film and the patterned poly-silicon layer, a portion of the second insulating film placed on a region differing from a first opening region of the diffused layer be selectively etched to form a second opening, the same impurity be simultaneously implanted into a portion of the poly-silicon layer and a portion of the diffused layer placed under a region of the second opening, and the portion of the poly-silicon layer be changed to a conductive layer simultaneously with the formation of a contact layer of the diffused layer placed under the region of the second opening.

Therefore, the implantation of the impurity can be performed in common for the formation of the conductive layer and the contact layer.

In addition to the above manufacturing method, it is preferred that a film thickness of the poly-silicon layer, remaining after the etching process performed to form the second opening, range from 1500 Å to 2500 Å on condition that a voltage proof of the metal-insulator-semiconductor-type condenser is equal to or less than 30 V.

Therefore, the electric short occurring between upper and lower electrodes of the metal-insulator-semiconductor-type condenser because the poly-silicon layer is excessively thinned and the undesirable decrease of the capacitance value occurring in the metal-insulator-semiconductor-type condenser because the poly-silicon layer is excessively thickened can be prevented.

In a manufacturing method of a semiconductor integrated circuit apparatus according to the present invention, a first opening is formed in a first insulating film placed in a forming region of a diffused layer used as a lower electrode of a metal-insulator-semiconductor-type condenser, a silicon nitride film is formed on the first insulating film in which the first opening is formed, and a poly-silicon layer is formed on the silicon nitride film in succession to the silicon nitride film.

Therefore, even though a first process, in which the first insulating film is selectively etched to form a second opening and a third opening in a base region, a second process, in which a fourth opening is formed in a region differing from a base region of the first region and a fifth opening is formed on the diffused layer, and a third process, in which the poly-silicon layer and the silicon nitride film are patterned in an etching process to remain as a portion of the poly-silicon layer and as a portion of the silicon nitride film on the diffused layer, are performed after the manufacturing method, because the surface of the silicon nitride film is covered with the poly-silicon layer, the silicon nitride film is protected. That is, because the surface of the silicon nitride film is not exposed to any etchant or oxygen in an oxygenic atmosphere, the deterioration of the silicon nitride film can be prevented.

It is preferred that the same conductive impurity be implanted into the third opening and the remaining poly-silicon layer to form an emitter region in the third opening and change the poly-silicon layer to a conductive layer simultaneously with the formation of the emitter region.

Therefore, the implantation of the conductive impurity can be performed in common for the formation of the emitter region and the conductive layer.

In addition, it is preferred that the poly-silicon layer be formed according to a chemical vapor deposition in the same manufacturing apparatus as that in which the silicon nitride film is formed and the silicon nitride film not be exposed to oxygen during the formation of the poly-silicon layer.

Therefore, in a conventional manufacturing method, a substrate on which a silicon nitride film is formed is taken out from a silicon nitride film forming apparatus, the silicon nitride film is exposed to oxygen in an oxygenic atmosphere when the substrate is put in a poly-silicon-forming apparatus, and the surface of the silicon nitride film is degraded. However, in the present invention, because the poly-silicon layer is formed in the same manufacturing apparatus as that in which the silicon nitride film is formed, the deterioration of the silicon nitride film can be prevented.

In addition, it is preferred that a second insulating film remain in a second insulating film-remaining step to cover peripheries of the remaining poly-silicon layer and the remaining silicon nitride film with the second insulating film and expose a portion of the remaining poly-silicon layer and a portion of the remaining silicon nitride film.

In a conventional manufacturing method, in cases where a forming region of the photoresist is not placed at a correct position because an exposing light is not correctly positioned, an opening area of the photoresist is shifted from a forming region of the poly-silicon layer and the silicon nitride film, the opening area of the photoresist is placed on another important layer, and the important area placed under the opening area of the photoresist is erroneously removed in an etching process. However, in the present invention, because the second insulating film remains to cover peripheries of the remaining poly-silicon layer and the remaining silicon nitride film with the second insulating film, there is no probability that the important area is erroneously removed in an etching process.

In addition, it is preferred that the poly-silicon layer remains after second, third, fourth and fifth openings are formed in an etching process and a film thickness of the poly-silicon layer range from 1500 Å to 2500 Å.

Therefore, the electric short occurring between upper and lower electrodes of the metal insulator semiconductor-type condenser because the poly-silicon layer is excessively thinned and the undesirable decrease of the capacitance value occurring in the metal insulator semiconductor type condenser because the poly-silicon layer is excessively thickened can be prevented.

DESCRIPTION OF THE PREFERRED EMBODIMENTS

Preferred embodiments of manufacturing methods of an MIS-type condenser and a semiconductor integrated circuit apparatus, the MIS-type condenser and the semiconductor integrated circuit apparatus according to the present invention are described with reference to drawings.

FIGS. 4 to 13 are cross-sectional views showing a manufacturing method of a semiconductor integrated circuit apparatus having an MIS-type condenser and a bipolar transistor according to a first embodiment of the present invention.

Figure 1:
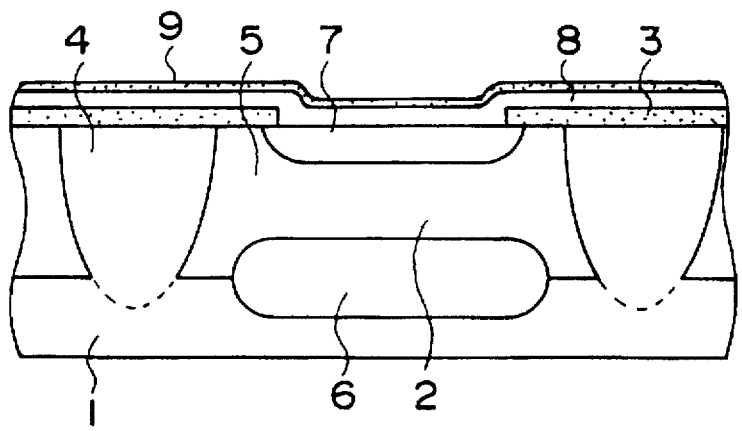
FIG. 1 is a first cross-sectional view showing a manufacturing method of a conventional MIS-type condenser.
Figure 2:
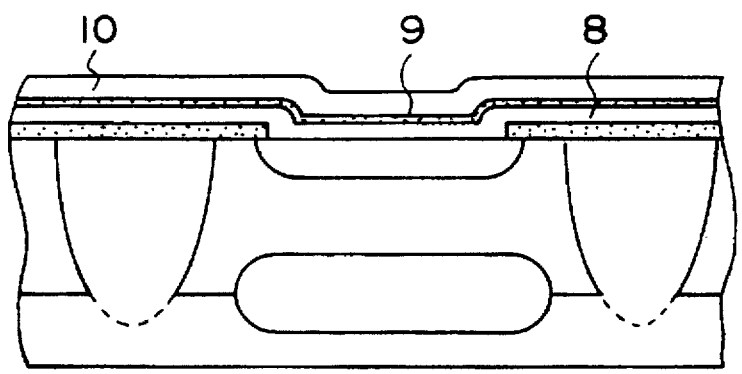
FIG. 2 is a second cross-sectional view showing the manufacturing method of the conventional MIS-type condenser.
Figure 3:
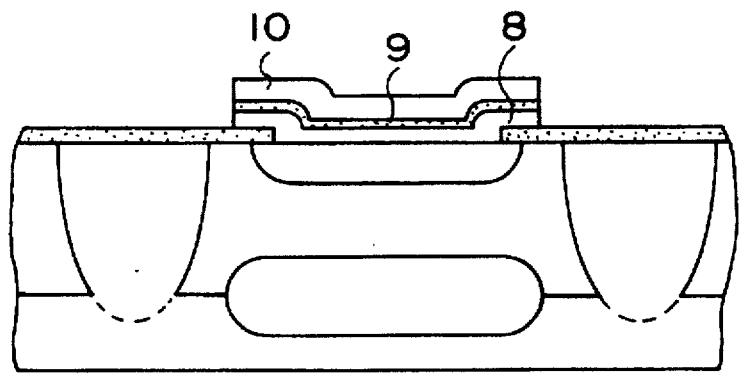
FIG. 3 is a third cross-sectional view showing the manufacturing method of the conventional MIS-type condenser.
Figure 4:
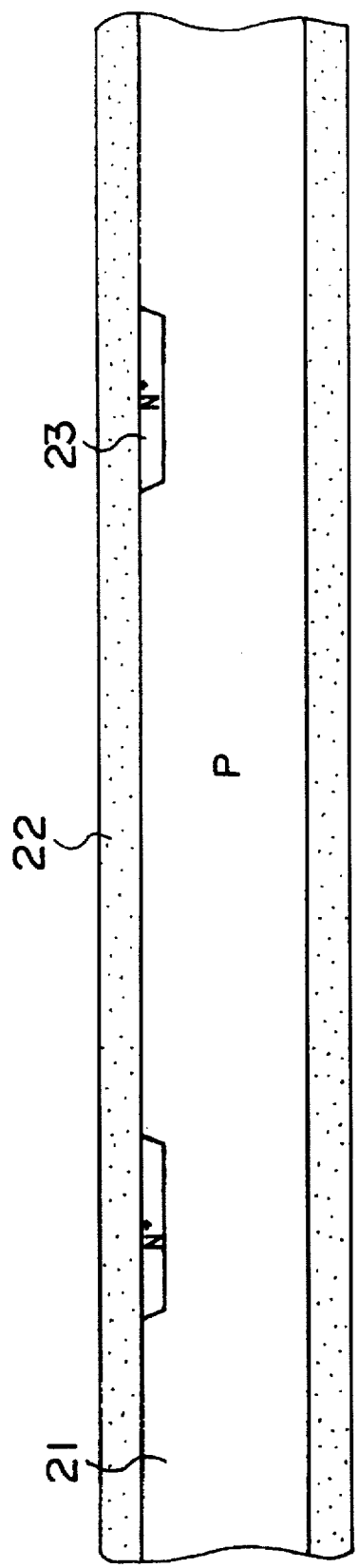
FIG. 4 is a first cross-sectional view showing a manufacturing method of a semiconductor integrated circuit apparatus having an MIS-type condenser and a bipolar transistor according to a first embodiment of the present invention.

As shown in FIG. 4, a thermal oxidized film 22 is formed on an upper surface of a p-type silicon semiconductor substrate 21, a first planned region of the substrate 21 in which the formation of an $n^+$-type buried layer 23 is planned is determined, a portion of the thermal oxidized film 22 placed on the first planned region is etched to form an opening region of the thermal oxidized film 22, an n-type impurity such as antimony (Sb) or arsenic (As) is implanted through the opening region to dope the first planned region of the substrate 21, and the n-type impurity is thermally diffused into the first planned region at a temperature of about 1000° C. for several hours to form the $n^+$-type buried layer 23.

Figure 5:
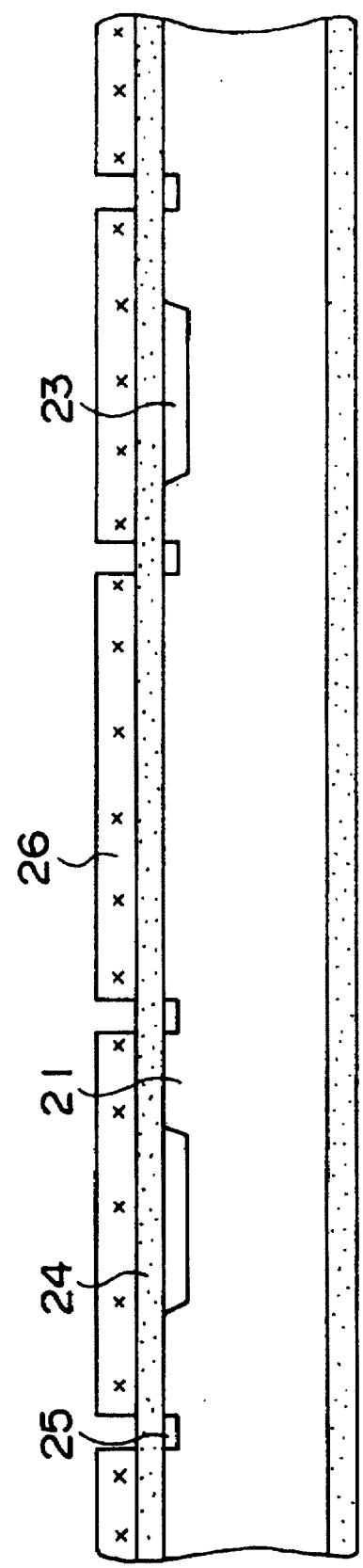
FIG. 5 is a second cross-sectional view showing the manufacturing method of the semiconductor integrated circuit apparatus according to the first embodiment of the present invention.
Figure 8:
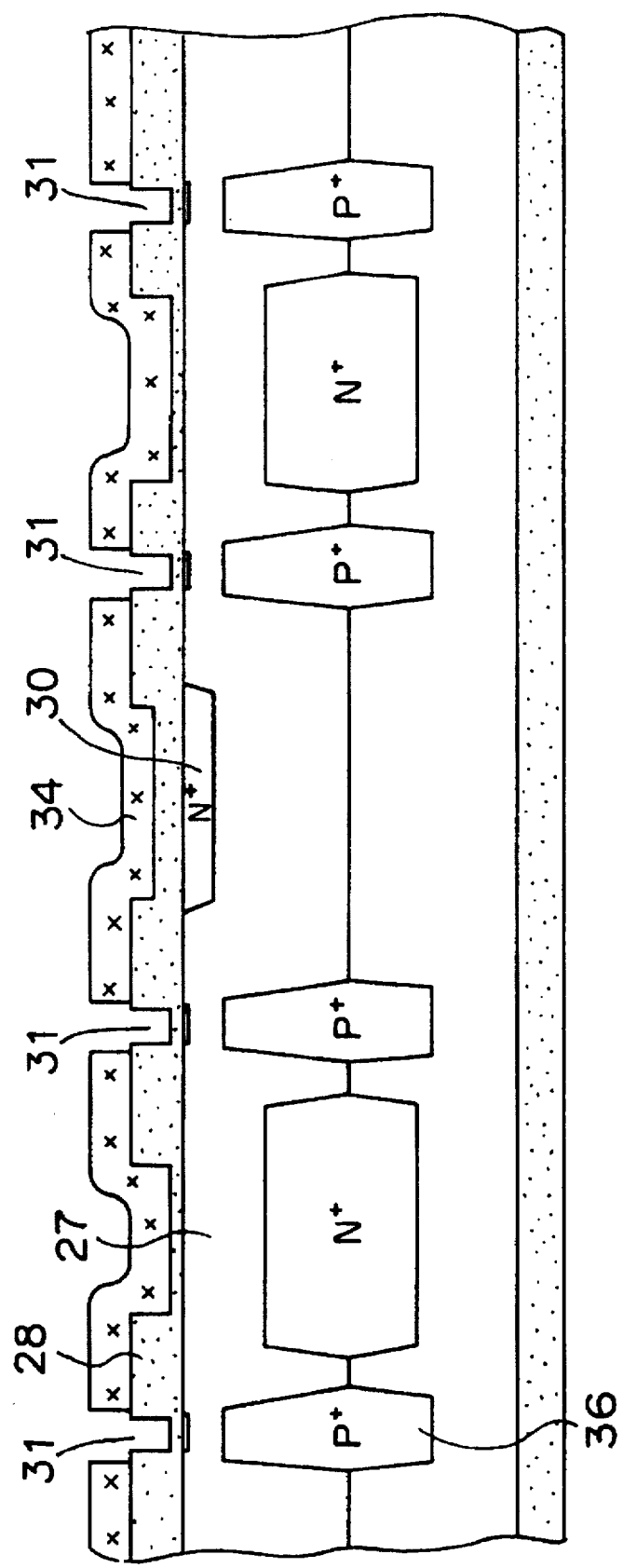
FIG. 8 is a fifth cross-sectional view showing the manufacturing method of the semiconductor integrated circuit apparatus according to the first embodiment of the present invention.

Thereafter, as shown in FIG. 5, all of the thermal oxidized film 22 is removed, a thermal oxidized film 24 is formed on the p-type silicon semiconductor substrate 21 and the $n^+$-type buried layer 23 at a thickness of about 400 angstroms (Å), a plurality of second planned regions 25 of the substrate 21 are determined in which the formation of a $p^+$-type lower side diffusion region (such as the $p^+$-type lower side diffusion region 36 shown in FIG. 8) placed under an upper/lower separating region is planned, a photoresist film 26 is formed on the thermal oxidized film 24 on condition that a plurality of portions of the thermal oxidized film 24 placed on the second planned regions of the substrate 21 are exposed, a p-type impurity such as boron (B) is implanted into the second planned regions 25 of the substrate 21 through a plurality of opening regions of the photoresist film 26 and the portions of the thermal oxidized film 24. In this case, in place of the ion-implantation of the boron, also applicable that the portions of the thermal oxidized film 24 be opened, the p-type impurity be deposited on the second planned regions of the substrate 21, and the p-type impurity be diffused into the second planned regions.

Figure 6:
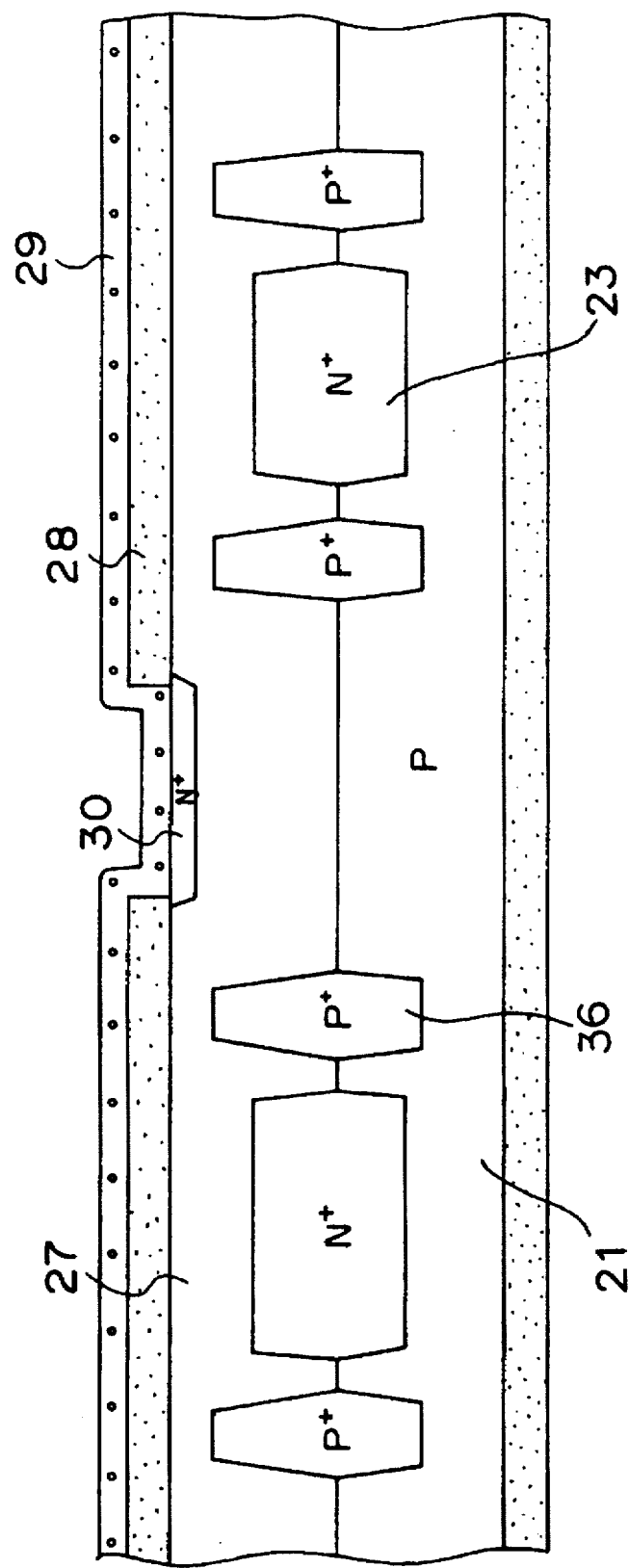
FIG. 6 is a third cross-sectional view showing the manufacturing method of the semiconductor integrated circuit apparatus according to the first embodiment of the present invention.

After the photoresist film 26 is removed, as shown in FIG. 6, the n-type impurity of the $n^+$-type buried layer 23 is slightly diffused into the substrate 21 to widen the $n^+$-type buried layer 23, the p-type impurity of the second planned regions 25 is slightly diffused into the substrate 21 to widen the second planned regions 25, the thermal oxidized film 24 is removed, an n-type epitaxial layer 27 of which a specific resistance ranges from 0.1 to 5 $\Omega^*$cm is formed on the semiconductor substrate 21 at a thickness of about 4 μm according to a well-known vapor phase epitaxy technique. In this case, the n-type impurity of the $n^+$-type buried layer 23 and the p-type impurity of the second planned regions 25 are slightly diffused into the semiconductor substrate 21 and the n-type epitaxial layer 27 during the formation of the epitaxial layer 27.

Thereafter, a thermal oxidized film 28 is formed on the upper surface of the epitaxial layer 27 at a film thickness of 500 angstroms in a thermal oxidation process performed at a temperature of about 1000 ° C. for several minutes, and the whole semiconductor substrate is thermally processed at a temperature of about 1000° C. for one or two hours to positively diffuse the n-type impurity of the $n^+$-type buried layer 23 and the p-type impurity of the second planned regions 25 into the semiconductor substrate 21 and the n-type epitaxial layer 27. Therefore, the second planned regions 25 are widen and changed to a plurality of $p^+$-type lower side diffusion regions 36. A depth of each lower side diffusion region 36 in the epitaxial layer 27 is about 3 μm which is deeper than a half of the depth of the epitaxial layer 27. Also, the whole semiconductor substrate is placed in an oxygen atmosphere, an $N_2$ atmosphere and a steam atmosphere, and the thermal oxidized film 28 formed on the upper surface of the epitaxial layer 27 grows to a film thickness of several thousands angstroms.

Figure 9:
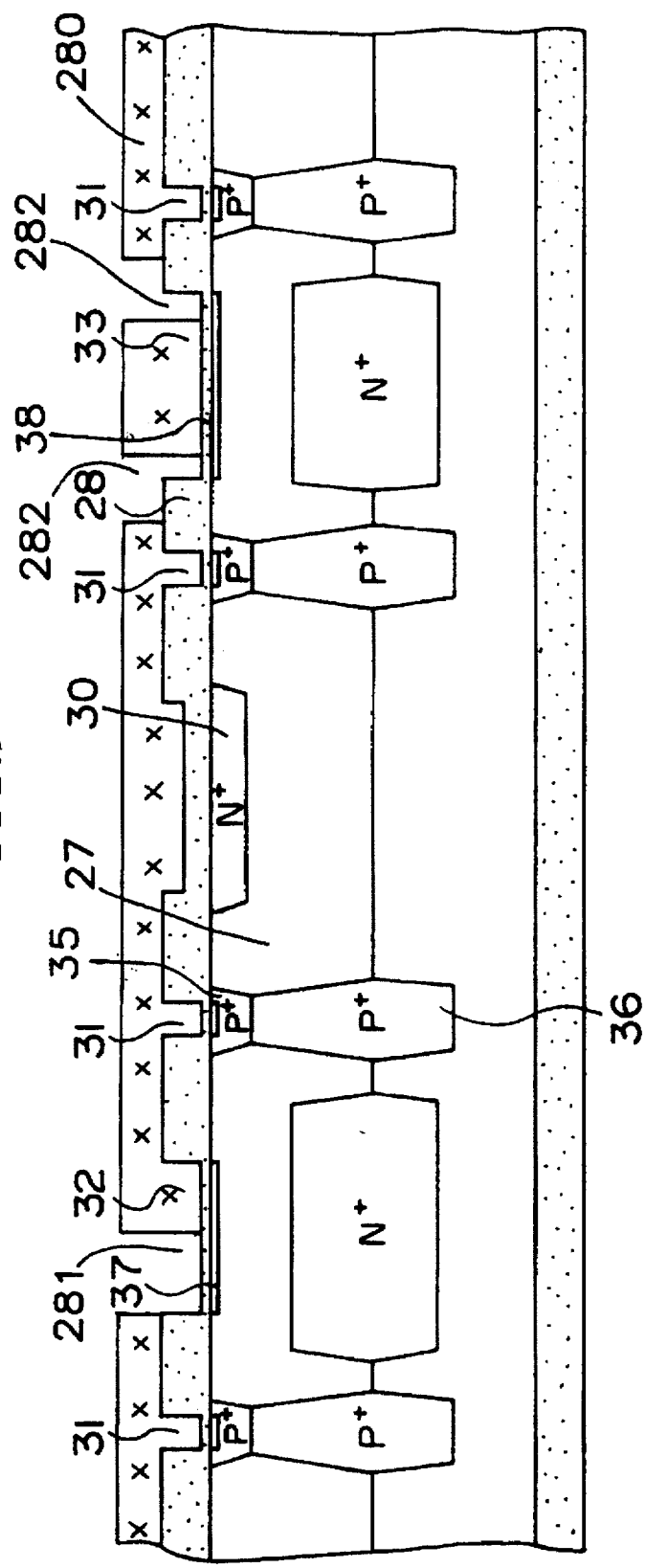
FIG. 9 is a sixth cross-sectional view showing the manufacturing method of the semiconductor integrated circuit apparatus according to the first embodiment of the present invention.

Thereafter, a lower layer electrode region of the epitaxial layer 27 is determined in which the formation of a lower layer electrode 30 of the MIS-type condenser is planned, a portion of the thermal oxidized film 28 placed on the lower layer electrode region is removed to expose the lower layer electrode region, the thermal oxidized film 28 and the lower layer electrode region are covered with a deposition film 29 (for example, a phosphorus glass) having an n-type impurity, and an n-type impurity such as phosphorus (P) is implanted into the lower layer electrode region of the epitaxial layer 27 to form the lower layer electrode 30. In this case, an oxidized thin film is formed on the upper surface of the lower layer electrode 30, and the oxidized film functions as a mask when a plurality of upper side diffusion regions (such as 35) and a base region (such as 37), shown in FIG. 9, are formed by implanting ions into portions of the epitaxial layer 27. In a modification of the first embodiment, also applicable that all of the thermal oxidized film 28 be removed and a silicon nitride film or a silicon oxidized film be formed on the surfaces of the epitaxial layer 27 and the lower layer electrode 30. Also, it is applicable that the silicon nitride film or the silicon oxidized film be formed according to chemical vapor deposition.

Figure 7:
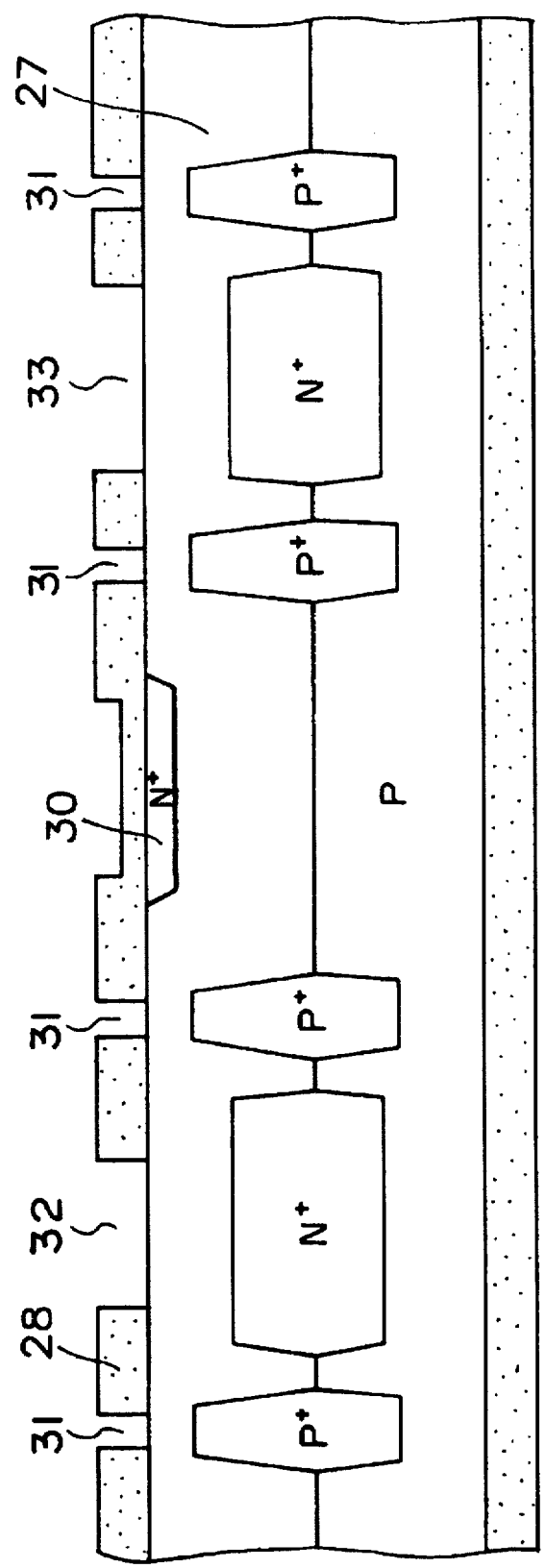
FIG. 7 is a fourth cross-sectional view showing the manufacturing method of the semiconductor integrated circuit apparatus according to the first embodiment of the present invention.

Thereafter, as shown in FIG. 7, a plurality of first impurity-leading holes 31 are formed by removing a portion of the thermal oxidized film 28 placed on a plurality of planned regions of the upper side diffusion regions (such as 35 shown in FIG. 9), a second impurity-leading hole 32 is formed by removing a portion of the thermal oxidized film 28 placed on a planned region of the base region (such as 37 shown in FIG. 9), and a third impurity-leading hole 33 is formed by removing a portion of the thermal oxidized film 28 placed on a planned region of a diffused resistance region (such as 38) also shown in FIG. 9. The formation of the impurity-leading holes 31, 32 and 33 is performed according to a dry etching technique while using a positive type resist film (not shown) as a mask.

Thereafter, as shown in FIG. 8, opening regions of the epitaxial layer 27 exposed to the impurity-leading holes 31, 32 and 33 are oxidized, and a thin oxidized film is formed in each of the opening regions of the epitaxial layer 27. The thin oxidized films function to reduce the damage caused to the epitaxial layer 27 in an ion-implanting process performed in a following step. Also, ions in the ion-implanting process are dispersed at random by the thin oxidized films, and the ions are uniformly implanted into the planned regions of the epitaxial layer 27 to form the upper side diffusion regions (such as 35 shown in FIG. 9), the base region (such as 37 shown in FIG. 9) and the diffused resistance region (such as 38 shown in FIG. 9). Thereafter, a mask 34 is formed on the thermal oxidized film 28 on condition that the mask 34 is not formed in the first impurity-leading holes 31. Therefore, the second and third impurity-leading holes 32 and 33 are covered with the mask 34. That is, a resist film functioning as a mask for blocking implanted ions is coated on all of the thermal oxidized film 28 and all of the thin oxidized films, and portions of the resist film placed in the first impurity-leading holes 31 are removed to form the mask 34.

Thereafter, as shown in FIG. 9, an impurity such as p-type boron (B) is implanted into the epitaxial layer 27 through the first impurity-leading holes 31 at prescribed conditions in a boron-implanting process, and the upper side diffusion regions 35 placed on the upper/lower separating region are formed. In this case, as shown in FIG. 8, an opening hole of the mask 34 placed on each first impurity-leading hole 31 is larger than the first impurity leading hole 31, the thermal oxidized film 28 mainly functions as a mask in the boron-implanting process, and the mask 34 is used to prevent the boron from being implanted into the lower layer electrode 30. Therefore, a forming position of the upper side diffusion regions 35 agrees with a position of the first impurity-leading hole 31 of the thermal oxidized film 28.

Thereafter, the mask 34 is removed, a thermal processing is performed for the whole semiconductor substrate, and the upper side diffusion regions 35 grow in a lower direction and come into contact with the lower side diffusion regions 36. In the first embodiment, because the upper side diffusion regions 35 grow to come into contact with the lower side diffusion regions 36 after the lower side diffusion regions 36 placed in the epitaxial layer 27 grow to be deeper than half of the depth of the epitaxial layer 27, a diffusing depth of each upper side diffusion region 35 can be made shallow to about 1 µm, and a diffusing period can be shortened to one hour at a temperature of 1000° C. Therefore, a growth in the width of each upper side diffusion region 35 in a lateral direction can be greatly shortened to about 1 µm, and a surface occupied area of each upper side diffusion region 35 can be greatly reduced. For example, in cases where the first impurity-leading hole 31 of the thermal oxidized film 28 has a width of 4 µm, the width of each upper side diffusion region 35 is about 6 µm.

Accordingly, the diffusion regions 35 and 36 are connected to each other at a shallow position of each upper/lower separating region which is separated from the surface of the epitaxial layer 27 by a distant shorter than half of the depth of the epitaxial layer 27, and a width of each lower side diffusion region 36 can be wider than that of each upper side diffusion region 35. Because an integrated degree of circuits in a semiconductor integrated circuit apparatus is determined by an occupied area of each element on the surface of the epitaxial layer 27, an occupied area required by each upper/lower separating region for the formation of one lower side diffusion region 36 and one upper side diffusion region 35 is not determined by the occupied area of the lower side diffusion region 36 but determined by the occupied area of the upper side diffusion region 35. Therefore, because a width of each upper side diffusion region 35 in a lateral direction is greatly shortened, the occupied area required by each upper/lower separating region can be greatly reduced.

Also, because a width of each lower side diffusion region 36 is wider than that of each upper side diffusion region 35, even if each first impurity-leading hole 31 is not correctly placed on a center of each lower side diffusion region 36 because a mask used for the formation of the upper side diffusion region 35 is not correctly placed, the diffusion regions 35 and 36 can be reliably connected to each other.

Thereafter, an impurity such as boron (B) ions is implanted and diffused into the planned regions of the base region 37, and the diffused resistance region 38, and the upper side diffusion regions 35, through the impurity-leading holes 31, 32 and 33 and the base region 37 and the diffused resistance region 38 are formed. Also, because the boron ions are again implanted into the upper side diffusion regions 35, an impedance of each upper side diffusion region 35 is decreased.

Accordingly, as shown in FIG. 7, because the impurity-leading holes 31, 32 and 33 are simultaneously formed and the positions of the upper side diffusion regions 35 are determined by the positions of the impurity-leading holes 31, a positional margin conventionally required for positioning the base region 37 and the diffused resistance region 38 in relation to the upper side diffusion regions 35 is not required.

In the first embodiment, the base region 37 and the diffused resistance region 38 are formed without using a mask covering the first impurity-leading holes 31. However, it is also applicable that a mask covering the first impurity-leading holes 31 be formed and an impurity be implanted and diffused into the planned regions of the base region 37 and the diffused resistance region 38. Also, it is applicable that the formation of the base region 37 and the diffused resistance region 38 be separately performed.

Also, in cases where opening holes of a resist mask corresponding to the base region 37 and the diffused resistance region 38 are set to be slightly larger than the impurity-leading holes 32 and 33, the base region 37 and the diffused resistance region 38 can be precisely positioned. In addition, the implantation of an excessive volume of impurity into each upper/lower separating region can be prevented.

Thereafter, a first region corresponding to a base contact region 39 (shown in FIG. 10) which is planned to be formed in the base region 37 and a pair of second regions corresponding to a pair of contact regions 40 (shown in FIG. 10) which are planned to be formed in the diffused resistance region 38 are determined, a photoresist film 280 is formed on the thermal oxidized film 28 and the thin oxidized films as a mask on condition that opening holes 281 and 282 of the photoresist film placed on the first and second regions, respectively are formed.

Thereafter, boron ions are implanted through opening holes and diffused into the base region 37, the base contact 39, the diffused resistance region 38, the contact regions 40 of the diffused resistance region 38 at a diffusing temperature of about 1000° C. for one hour.

Figure 10:
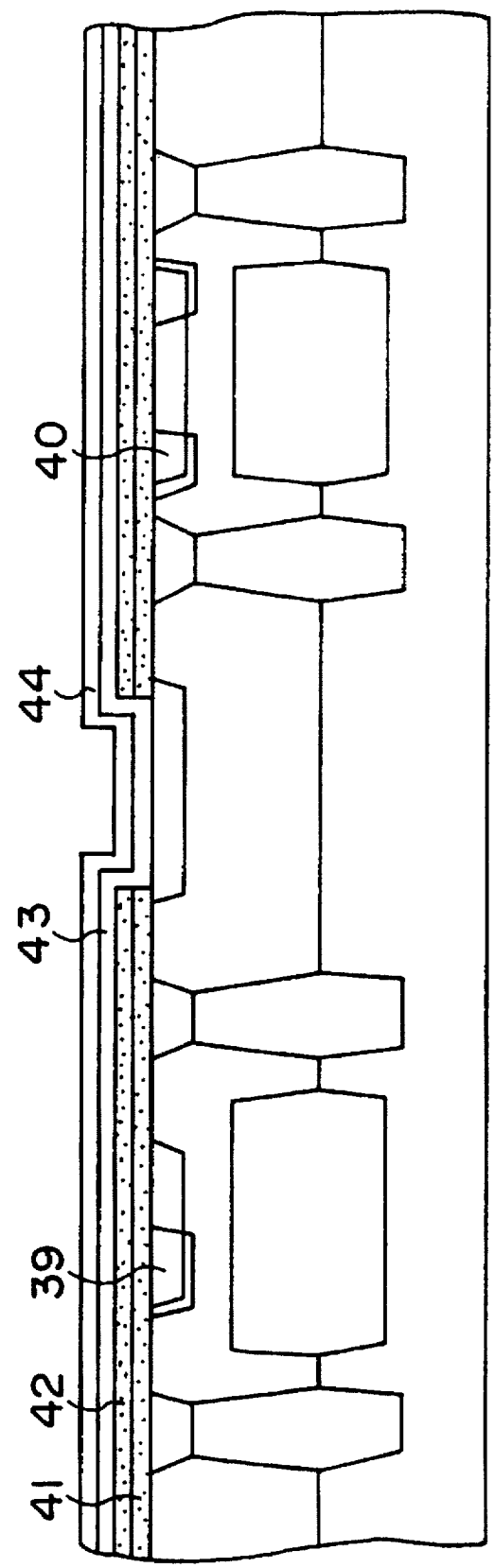
FIG. 10 is a seventh cross-sectional view showing the manufacturing method of the semiconductor integrated circuit apparatus according to the first embodiment of the present invention.

Thereafter, the thermal oxidized film 28 and the photoresist film are removed, and insulating films 41 and 42, as shown in FIG. 10, are formed on the whole semiconductor substrate. In detail, a non-doped silicon oxidized film is uniformly deposited on the whole semiconductor substrate to form the insulating film 41 at a thickness of several thousands angstroms, and a phosphorus-doped silicon oxidized film 42 is uniformly deposited on the insulating film 41 to form the insulating film 42 at a thickness of several thousands angstroms. Each of the insulating films 41 and 42 has a uniform film thickness. The reason that the insulating films 41 and 42 are arranged in place of the thermal oxidized film 28 and the photoresist film is now described. In the case of a silicon oxide film representing the thermal oxidized film 28 and the photoresist film 280 shown in FIG. 9, because the silicon oxide film placed on a planned emitter (53 shown in FIG. 13) region is thinner than that of a planned collector contact region, the epitaxial layer 27 placed in the planned emitter region is etched before an impurity-leading hole for the planned collector contact region is completely opened. The insulating films 41 and 42 having a uniform film thickness are formed, and the etching of the epitaxial layer 27 placed in the planned emitter region is prevented. Also, because of a contacting property of the insulating films 41 and 42, the intrusion of metal ions into the epitaxial layer 27 is prevented. In cases where it is not required to prevent the intrusion of metal ions, it also applicable that a semiconductor insulating film such as a silicon oxide film, a silicon nitride film or the like be formed in place of the insulating films 41 and 42. For example, in the case of the insulating films 41 and 42, the insulating films 41 and 42 are formed at a film thickness of 6000 angstroms (twice 3000 angstroms). In contrast, in the case of the single semiconductor insulating film, the semiconductor insulating film is formed at a film thickness ranging from 2000 to 3000 angstroms.

Thereafter, the insulating films 41 and 42 are densified in an oxygen atmosphere at a temperature of about 800° C. for one hour. The densification of the insulating films 41 and 42 is performed before the formation of a nitride film.

Thereafter, as shown in FIG. 10, portions of the insulating films 41 and 42 placed on a planned dielectric film region of the epitaxial layer 27 in which the formation of a dielectric thin film of an MIS-type capacitor is planned are removed by using a negative-type photo-resist film, and the dielectric thin film is formed. In detail, the portions of the insulating films 41 and 42 are opened in a wet etching process, a silicon nitride film 43 is deposited on the insulating film 42, and an open hole of the insulating films 41 and 42, at a film thickness of several hundreds angstroms in a low pressure chemical vapor deposition process, and a poly-silicon film 44 is deposited on the silicon nitride film 43 at a film thickness of several thousands angstroms in another low pressure chemical vapor deposition process in succession to the formation of the silicon nitride film 43. As an example, the film thickness of the silicon nitride film 43 is about 400 angstroms, and the film thickness of the poly-silicon film 44 ranges from 2000 to 3000 angstroms.

In this case, a non-reacted Si substance not reacted with nitrogen (N) and an intermediate product (for example, Si—O—N), not completely reacted with the nitrogen, surely exist in the silicon nitride film 43. Because the poly-silicon film 44 is immediately formed on the silicon nitride film 43 in succession to the formation of the silicon nitride film 43 without performing any etching process, the non-reacted Si substance and the intermediate product of the silicon nitride film 43 are not oxidized even though the whole semiconductor substrate having the silicon nitride film 43 and the poly-silicon film 44 thereon is placed in an oxygen atmosphere. Also, because the poly-silicon film 44 is arranged on the silicon nitride film 43, any weak spot of the silicon nitride film 43 is not removed even though the whole semiconductor substrate having the silicon nitride film 43 and the poly-silicon film 44 is immersed in an etching liquid.

Also, the poly-silicon film 44 is used as a protective layer and an electrode to prevent the exposure of the silicon nitride film 43 to an etching liquid or oxygen in subsequent manufacturing steps.

Also, because the silicon nitride film 43 is formed prior to an emitter diffusion process and after the base diffusing process, an increasing volume of weak spots in the silicon nitride film 43 can be reduced. For example, the change of the intermediate product (Si—O—N) to $SiO_2$ or SiN can be prevented. Also, even though an etching process is performed after the formation of the silicon nitride film 43 and the poly-silicon film 44, because the silicon nitride film 43 is protected by the poly-silicon film 44, dielectric characteristics of the silicon nitride film 43 can be maintained.

In the first embodiment, the silicon nitride film 43 and the poly-silicon film 44 are formed according to the low pressure chemical vapor deposition technique to prevent the oxidization of the silicon nitride film 43. However, it is also applicable that the silicon nitride film 43 and the poly-silicon film 44 be successively formed in a non-oxygenic atmosphere.

Figure 11:
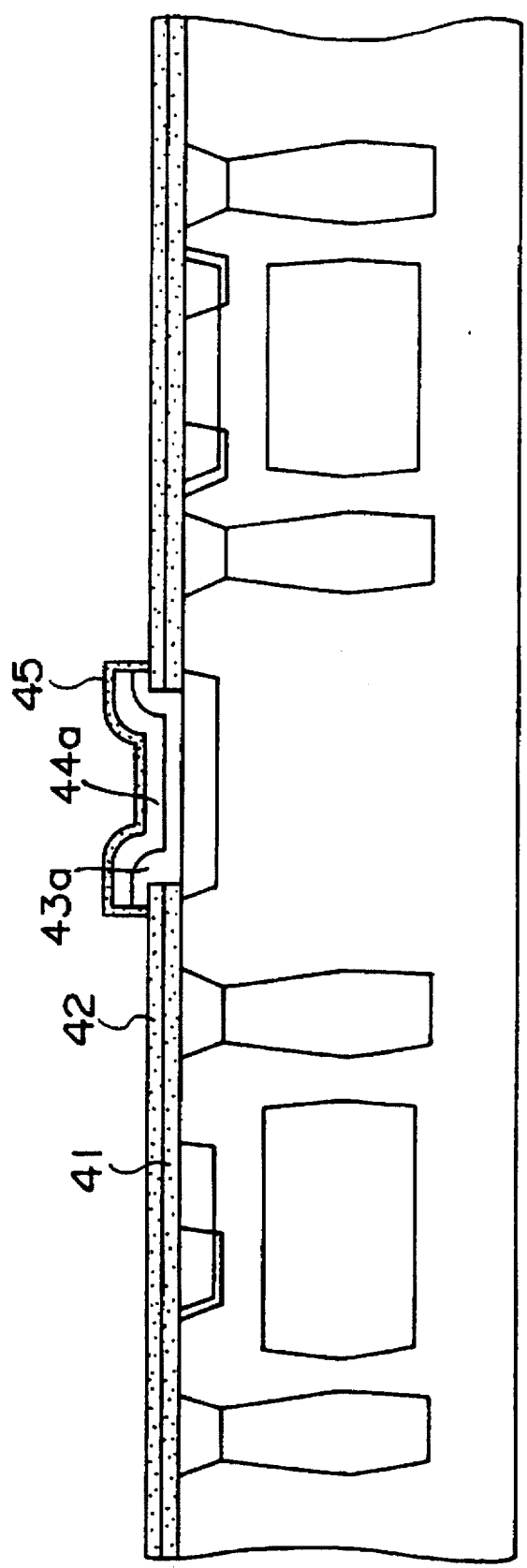
FIG. 11 is an eighth cross-sectional view showing the manufacturing method of the semiconductor integrated circuit apparatus according to the first embodiment of the present invention.

Thereafter, as shown in FIG. 11, portions of the silicon nitride film 43 and the poly-silicon film 44 not placed on the open hole of the insulating films 41 and 42 are etched by using fluorine-type dry etching materials to form a patterned silicon nitride film 43a and a patterned poly-silicon film 44a placed on the open hole and on portions of the insulating film 42 surrounding the open hole. The patterned silicon nitride film 43a functions as a dielectric film of an MIS-type condenser. For example, a fluorine-type etching material $CF_4+O_2$ is used to etch the poly-silicon film 44, and a fluorine-type etching material $CF_4+O_2+N_2$ is used to etch the silicon nitride film 43. Because the fluorine-type etching materials are similar to each other, two etching steps are successively performed in the same chamber.

If a silicon oxide film had been undesirably formed on the silicon nitride film 43 and the silicon oxide film were exposed, the silicon oxide film would be etched by the fluorine-type dry etching materials, and the dielectric characteristics of the silicon nitride film 43 would be undesirably changed. However, because all of the upper surface of the silicon nitride film 43 placed on the open hole of the insulating films 41 and 42 is covered with the poly-silicon film 44, the surface of the silicon nitride film 43 placed on the open hole is not etched by the fluorine-type dry etching materials.

Thereafter, the poly-silicon film 44a and the insulating film 42 are baked to form a silicon oxide ($SiO_2$) film 45 on the poly-silicon film 44a. End sides of the poly-silicon film 44a and the silicon nitride film 43a are also covered with the silicon oxide ($SiO_2$) film 45. Because an upper surface of the phosphorus-doped silicon oxidized film 42 becomes rough when the phosphorus-doped silicon oxidized film 42 is exposed to the fluorine-type dry etching materials, the insulating film 42 is baked to form an oxide film on the insulating film 42. Therefore, a degree of adhesion between a resist film used in a following contact hole-forming process and the insulating film 42 is heightened, and a portion of the insulating film 42 can be preferably etched by using the resist film without any peeling of the resist film. In the first embodiment, a baking process is performed to form the silicon oxide ($SiO_2$) film 45 and the oxide film. However, it also applicable that insulating films be deposited on the poly-silicon film 44a and the insulating film 42 according to the chemical vapor deposition in place of the baking formation of the silicon oxide ($SiO_2$) film 45 and the oxide film.

Figure 12:
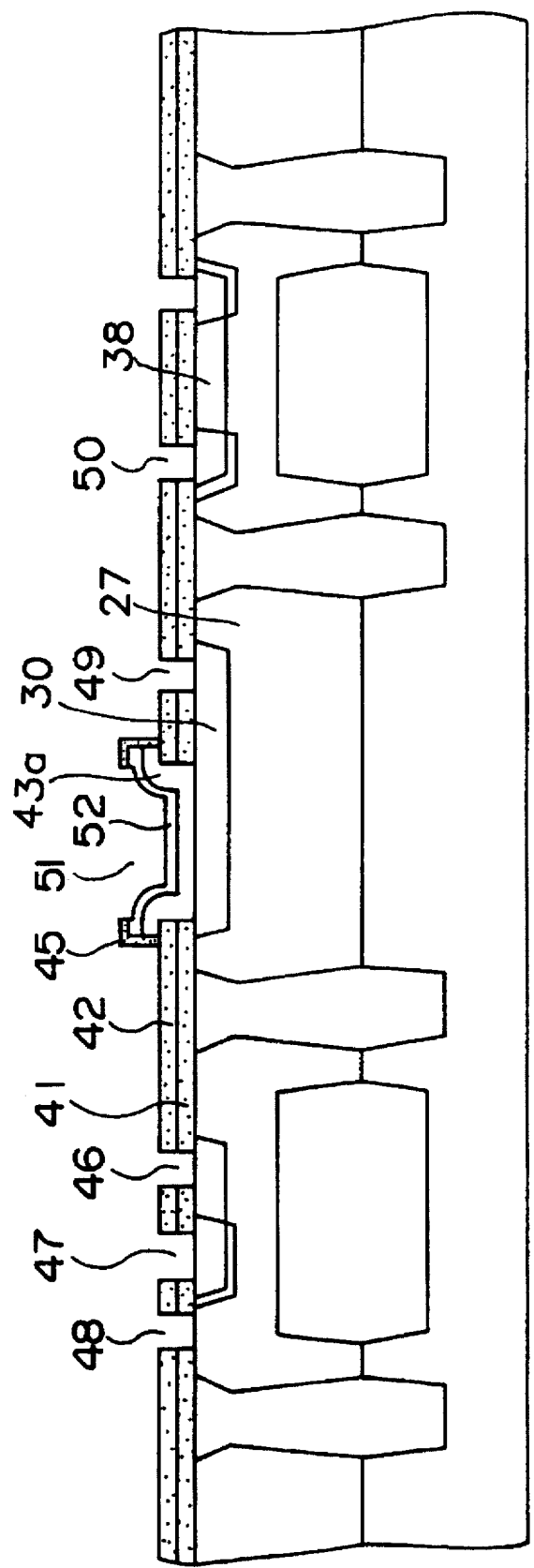
FIG. 12 is a ninth cross-sectional view showing the manufacturing method of the semiconductor integrated circuit apparatus according to the first embodiment of the present invention.

Thereafter, as shown in FIG. 12, a photoresist film (not shown) is formed on all over the insulating film 42 and the silicon oxide ($SiO_2$) film 45 and is patterned, and portions of the insulating films 41 and 42 and the silicon oxide ($SiO_2$) film 45, placed on a planned contact region of an emitter region, on a planned contact region of a base region, on a planned contact region of a collector, on a contact region of a lower electrode, on a planned contact region of the diffused resistance region 38 and on a planned poly-silicon electrode of the MIS-type condenser, are removed according to an anisotropic dry etching technique while using the photoresist film as a mask, and a plurality of opening contact holes 46 to 51 are formed. In this case, the silicon oxide ($SiO_2$) film 45 remains on the upper side surfaces of the thinned poly-silicon film 52 and on the end surfaces of thinned poly-silicon film 52 and silicon nitride film 43a.

Therefore, even though the major portion of the silicon oxide ($SiO_2$) film 45 is removed and the poly-silicon film 44a is thinned to form a thinned poly-silicon film 52, the thinned poly-silicon film 52 remains on the silicon nitride film 43a to protect the silicon nitride film 43a. That is, the deterioration of the dielectric characteristics of the silicon nitride film 43a in the etching process can be prevented. For example, in cases where the anisotropic dry etching for the formation of the contact holes 46 to 51 is performed by using an etching gas $CHF_3+O_2$, an etching rate ratio of the silicon oxide ($SiO_2$) film to the poly-silicon film is almost $SiO_2$/poly-silicon=8/1. Also, because a defect occurs on a surface of the epitaxial layer 27 exposed to the contact holes 46 to 51 in the anisotropic dry etching, an etching acceleration energy is reduced by using an etching gas $NF_3$ in a final period of the anisotropic dry etching, and the epitaxial layer 27 is slightly etched after the removal of the insulating films 41 and 42. Therefore, when the insulating films 41 and 42 having the film thickness of 6000 angstroms and a surface portion of the epitaxial layer 27 having a film thickness of 100 angstroms are etched in the anisotropic dry etching, an upper portion of the poly-silicon film 44a (shown in FIG. 11) is etched by a film thickness of about 1000 angstroms, and a lower portion of the poly-silicon film 44a (shown in FIG. 11) having a film thickness of about 2000 angstroms remains to form the thinned poly-silicon film 52.

Figure 14:
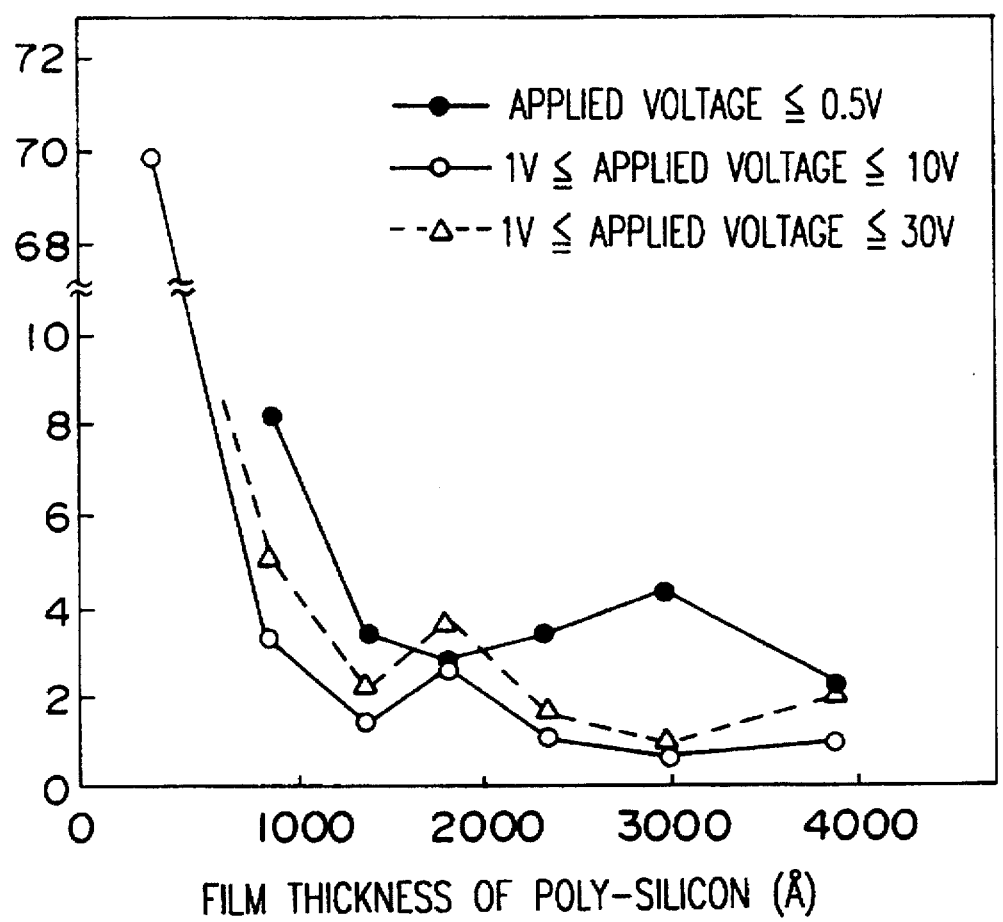
FIG. 14 shows a graph indicating the relationship between a film thickness of a poly-silicon according to the present invention and a voltage proof defect rate.

The relationship between a film thickness of a poly-silicon and a voltage proof defect rate has been experimentally examined. Seven poly-silicon samples having film thicknesses 500, 1000, 1500, 2000, 2500, 3000 and 4000 angstroms respectively were prepared, and three applied voltages were set. A first applied voltage was equal to or lower than 0.5 V, a second applied voltage ranged from 1 to 10 V, and a third applied voltage ranged from 1 to 30 V. As shown in FIG. 14, in cases where the poly-silicon sample was thinned to a film thickness equal to or lower than 1000 angstroms, a voltage proof defect rate rapidly increased. Therefore, in cases where a film thickness of poly-silicon is equal to or more than about 1500 angstroms, a voltage proof defect rate can be reduced to a value equal to or less than 2%. As a result of the experiment, it is required to determine film thicknesses of the insulating films 41 and 42 and the poly-silicon film 44 while considering an etching rate for the purpose of a thinned poly-silicon film remain having a film thickness equal to or more than 1500 angstroms.

Also, there is another effect in the film-thinning operation for the poly-silicon film 44. That is, an impurity is implanted and diffused in an emitter region and the poly-silicon film 44 in a subsequent step. In this case, because the poly-silicon film 44 is thinned to 2500 angstroms, for example, a density of the impurity in the thinned poly-silicon film 52 is increased by ⅓ as compared with that in the poly-silicon film 44 having the film thickness of 3000 angstroms. Therefore, there is an effect that a poly-silicon electrode having a lower resistance value is formed.

In the first embodiment, it is preferred that a film thickness of the thinned poly-silicon film 52 range from 1500 to 2500 angstroms on condition that a voltage proof of the MIS-type condenser is equal to or less than 30 V.

After the photoresist film (not shown) is removed, another photoresist film (not shown) is formed all over the insulating film 42, and the thinned poly-silicon film 52, and is patterned to expose the planned contact region of an emitter (53 shown in FIG. 13) region, the planned contact region of a collector (54 shown in FIG. 13) region and the planned contact region of a lower electrode (30 shown in FIG. 6) placed in the epitaxial layer 27, and arsenic (As) ions are implanted into the planned contact regions at a dope rate of $10^{15}$ to $10^{16}$ $cm^{-2}$ per second while using the photoresist film as a mask. Therefore, the contact regions of the emitter region, the collector region and the lower electrode are formed. In this case, the arsenic (As) ions are also implanted into the thinned poly-silicon electrode 52, so that a resistance value of the thinned poly-silicon electrode 52 is further reduced, as is described above.

Accordingly, because the emitter region is formed after the silicon nitride film 43a is formed, any thermal operation required for the formation of the silicon nitride film 43a is not performed after the formation of the emitter region, and an undesirable change of a grounded emitter forward current amplification factor $h_{FE}$ can be prevented.

Figure 13:
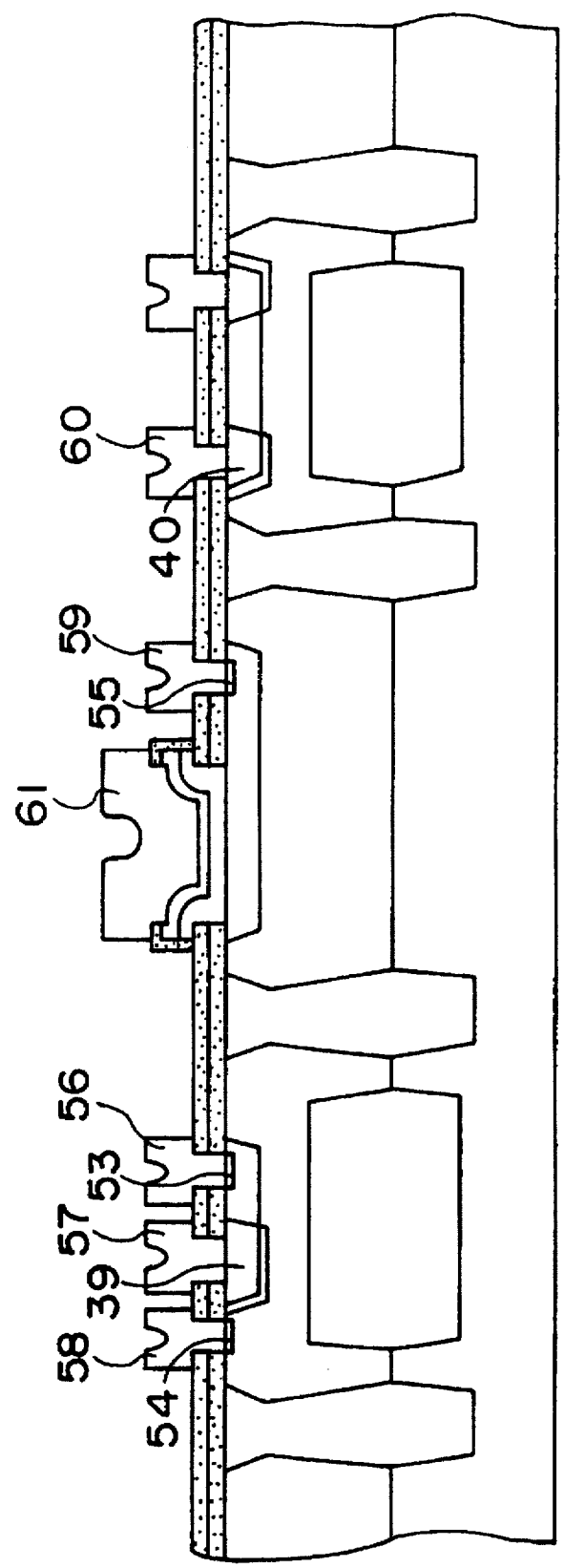
FIG. 13 is a tenth cross-sectional view showing the manufacturing method of the semiconductor integrated circuit apparatus according to the first embodiment of the present invention.

Thereafter, because oxide films are formed on surface portions of the epitaxial layer 27 exposed to the contact holes 48 to 51, the oxide films are slightly etched. In detail, an acceleration energy given to an etching gas $NF_3$ is reduced, and the oxide films are slightly etched by the etching gas $NF_3$. Thereafter, as shown in FIG. 13, aluminum electrodes 58 to 61 are formed in the contact holes 48 to 51, respectively.

Accordingly, the emitter region 53 comes into ohmic-contact with an emitter electrode 56, the base contact region 39 comes into ohmic-contact with a base electrode 57, the contact region 55 of the lower layer electrode region 30 comes into ohmic-contact with the lower layer electrode 59, the contact regions 40 of the diffused resistance region 38 come into ohmic-contact with the diffused resistance electrode 60, and an upper electrode 61 of an MIS-type condenser comes into ohmic-contact with the thinned poly-silicon film 52.

In the first embodiment, each electrode is formed by a single-layered metal. However, it is also applicable that each electrode be formed by a multi-layered metal. In this case, a second-layered metal is formed on an insulating film such as PIX, and a passivation film is formed on the second-layered metal.

Accordingly, a semiconductor integrated circuit apparatus having an MIS-type condenser and a bipolar transistor is manufactured.

In the above manufacturing method, the poly-silicon film 44 is formed without forming any oxide film on the silicon nitride film 43. The effect of the manufacturing method according to the first embodiment is estimated with reference to FIG. 15.

Figure 15B:
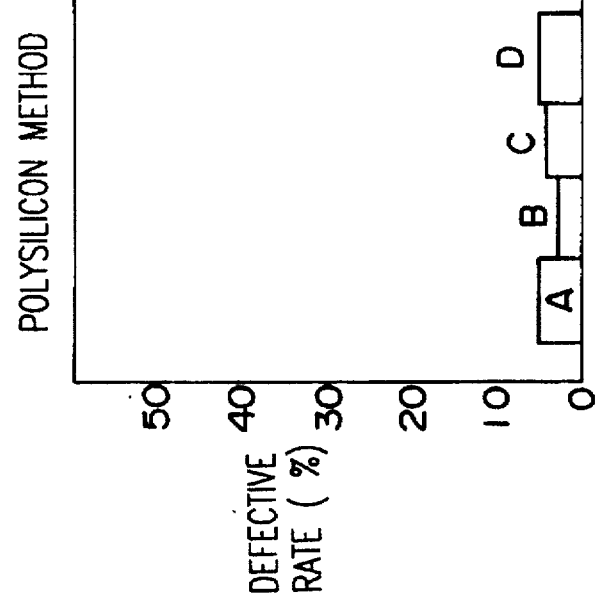
FIG. 15 shows a graph indicating the relationship between a voltage applied to an MIS-type condenser manufactured according to a Conventional method and a defective rate and another graph indicating the relationship between a voltage applied to an MIS-type condenser manufactured according to a poly-silicon method of the first embodiment and a defective rate.
Figure 15A:
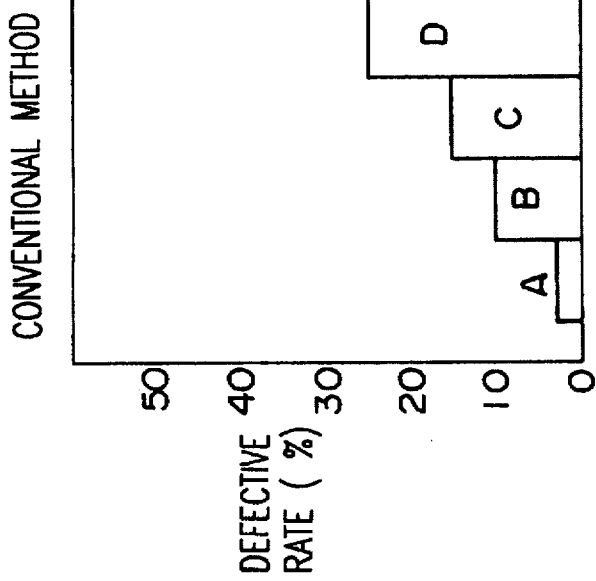

FIG. 15 shows a graph indicating the relationship between a voltage applied to an MIS-type condenser manufactured according to a Conventional method and a defective rate and another graph indicating the relationship between a voltage applied to an MIS-type condenser manufactured according to a poly-silicon method of the first embodiment and a defective rate.

As shown in FIG. 15, an MIS-type condenser was manufactured according to a Conventional method in which a poly-silicon film was not formed on the silicon nitride film 43. That is, after the silicon nitride film 43 was formed (FIG. 10), a photoresist was formed on the silicon nitride film 43 and was patterned to form a patterned photoresist on a planned dielectric layer, and the silicon nitride film 43 was patterned. Thereafter, the manufacturing processes from the baking process to the emitter diffusing process were performed in the same manner. Thereafter, in a slight etching of the epitaxial layer 27 exposed to the contact holes, a resist was formed on the patterned silicon nitride film 43, the oxide films of the epitaxial layer 27 are removed by using a dilute hydrofluoric acid, and, after the resist was removed, the epitaxial layer 27 exposed to the contact holes was again etched by the dilute hydrofluoric acid for a short time, and metal was formed on the silicon nitride film and the epitaxial layers 27 exposed in the contact holes as electrodes. Therefore, the silicon nitride film was oxidized in the baking operation to heighten the adhesion between a photoresist and the silicon nitride film and was exposed to the dilute hydrofluoric acid in a final etching. Also, contact etching processes were performed in a period between the baking operation and the emitter diffusing operation, a photoresist used for an emitter implantation was formed on the silicon nitride film and then, after emitter implantation, the photoresist was, the photoresist is removed. Therefore, the silicon nitride film was additionally oxidized and heated. In addition, there was a case that the silicon nitride film came into contact with an etching liquid passing through a hole of a resist.

Also, an MIS-type condenser was manufactured according to a poly-silicon method which is the same as the first embodiment.

Thereafter, a voltage lower than 1 V was applied to a first group of condensers (A), a voltage ranging from 1 to 10 V was applied to a second group of condensers (B), a voltage ranging from 1 to 20 V are applied to a third group of condensers (C), and a voltage ranging from 1 to 30 V are applied to a fourth group of condensers (D).

As a result, a defect rate in the Conventional method ranged from 3 to 25%, and a defect rate in the poly-silicon method was lower than 5%.

(Second Embodiment)

Next, manufacturing methods of an MIS-type condenser and a semiconductor integrated circuit apparatus, the MIS-type condenser and the semiconductor integrated circuit apparatus according to a second embodiment are described with reference to FIGS. 16 to 22.

FIGS. 16 to 22 are cross-sectional views showing a manufacturing method of a semiconductor integrated circuit apparatus having an MIS-type condenser and a bipolar transistor according to a second embodiment of the present invention.

Figure 16:
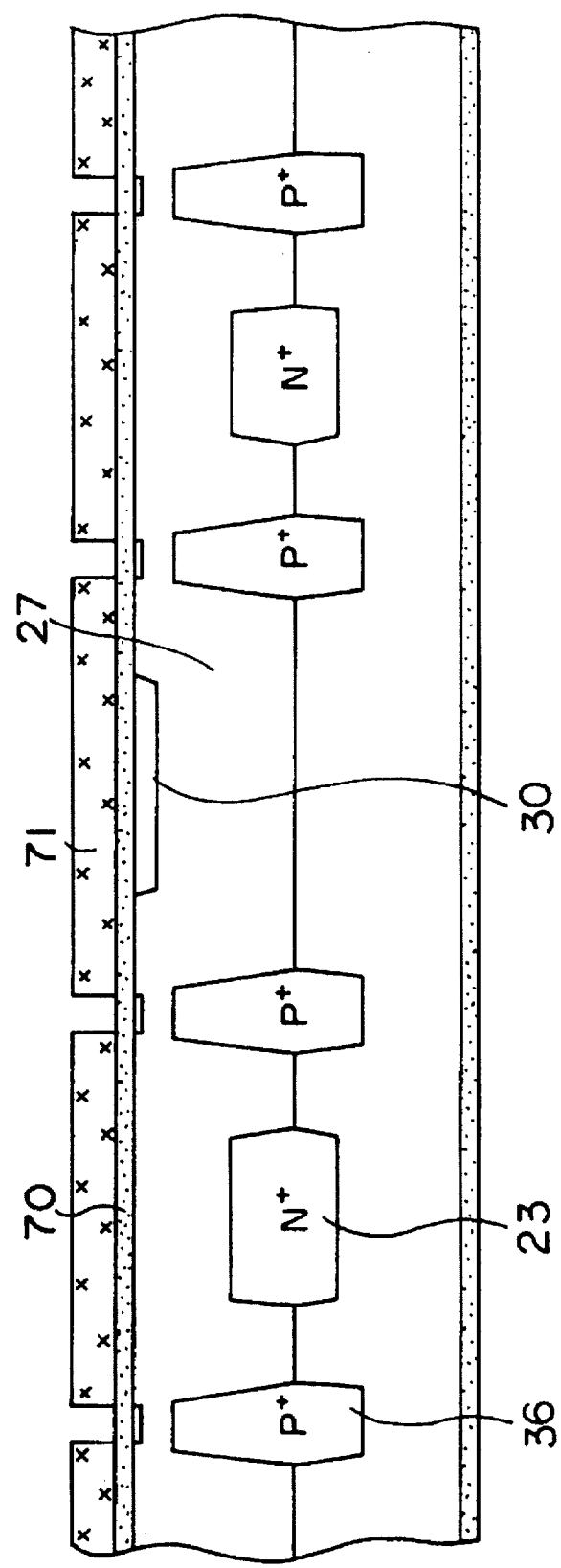
FIG. 16 is a first cross-sectional view showing a manufacturing method of a semiconductor integrated circuit apparatus having an MIS-type condenser and a bipolar transistor according to a second embodiment of the present invention.
Figure 17:
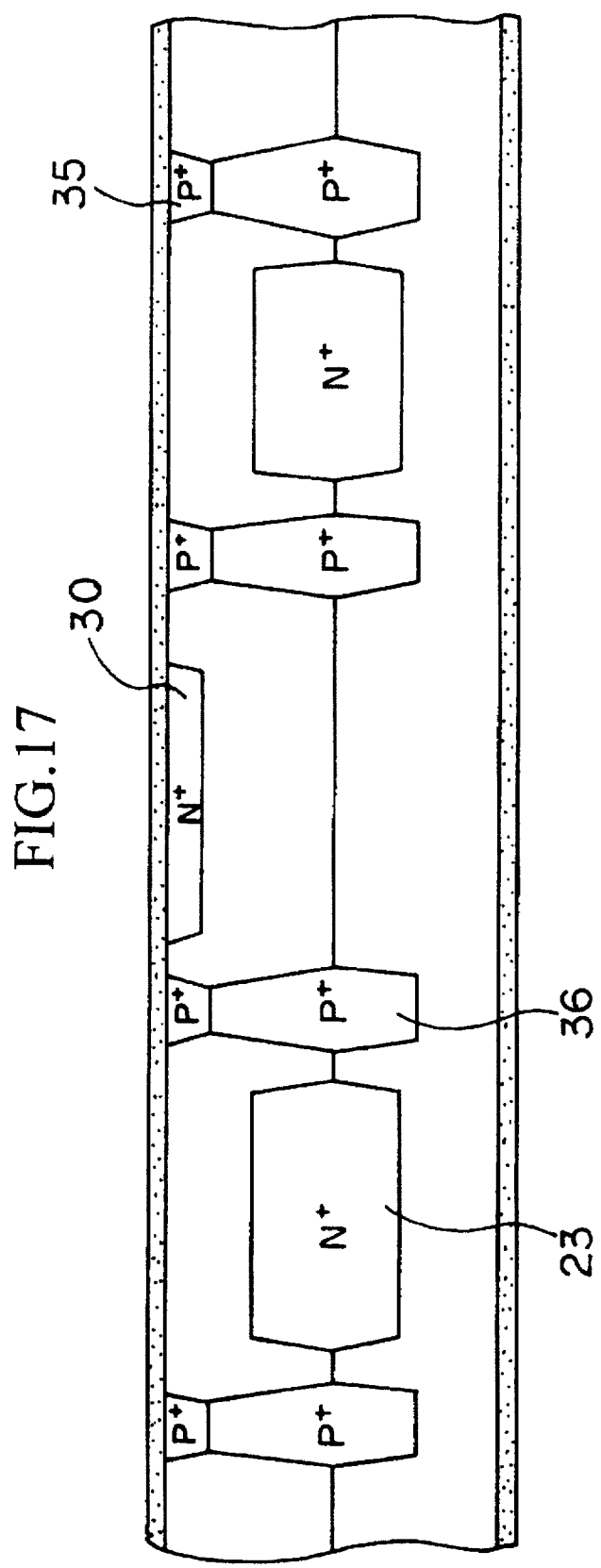
FIG. 17 is a second cross-sectional view showing the manufacturing method of the semiconductor integrated circuit apparatus according to the second embodiment of the present invention.

The lower side diffusion regions 36, the $n^+$-type buried layer 23 and the lower layer electrode region 30 are formed in the same manner as in the first embodiment. After the thermal oxidized film 28 and the phosphorus glass 29 are removed, as shown in FIG. 16, a thinned oxidized film 70 is formed on the epitaxial layer 27, and the lower layer electrode region 30, at a film thickness of about 500 angstroms. Thereafter, a resist 71 is formed on the thinned oxidized film 70 and is patterned to form a plurality of opening holes of the resist 71 at positions placed above the lower side diffusion regions 36, and ions of a p-type impurity are implanted into portions of the epitaxial layer 27 through the opening holes. Thereafter, as shown in FIG. 17, the resist 71 is removed, the impurity implanted into the portions of the epitaxial layer 27 is diffused to form the upper side diffusion regions 35, and the upper side diffusion regions 35 come into contact with the lower side diffusion regions 36.

Figure 18:
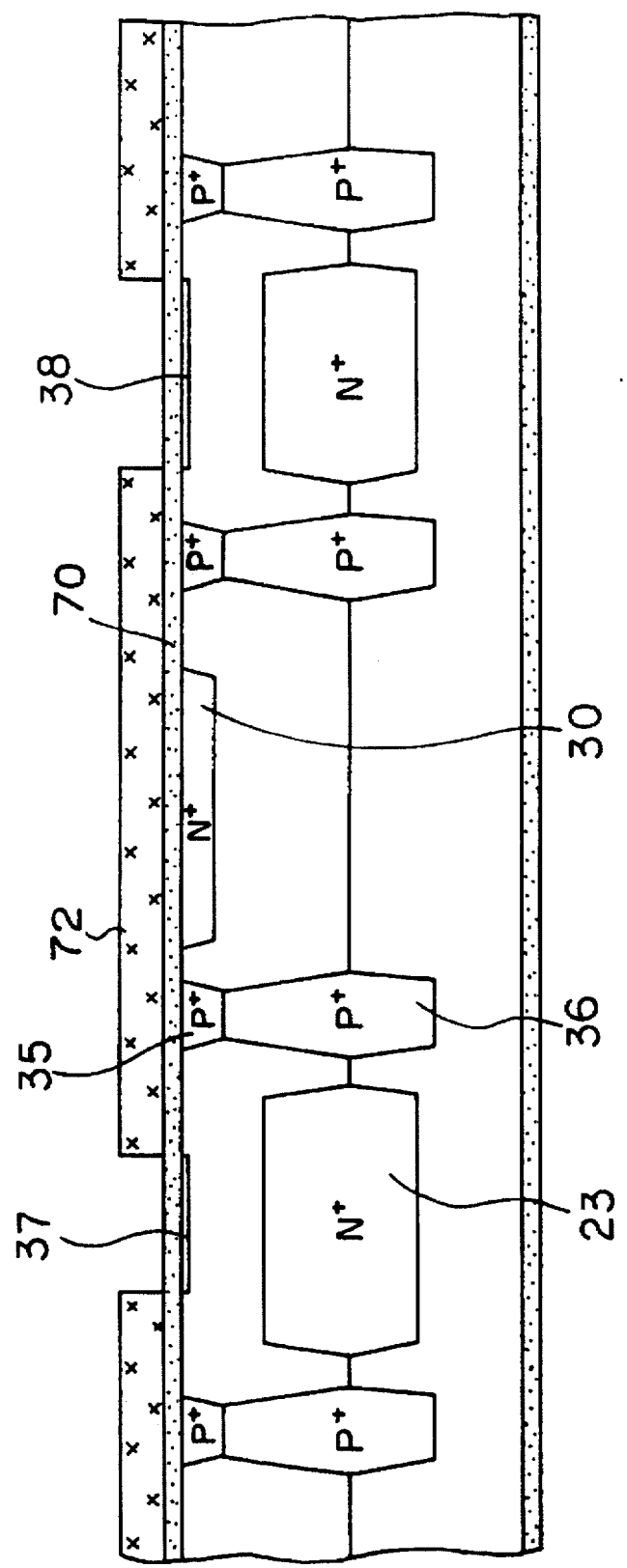
FIG. 18 is a third cross-sectional view showing the manufacturing method of the semiconductor integrated circuit apparatus according to the second embodiment of the present invention.

Thereafter, as shown in FIG. 18, a resist 72 is formed on the thinned oxidized film 70 and is patterned to form a plurality of opening holes of the resist 72 at positions placed above a planned base region 37 and a planned diffused resistance region 38, and ions of a p-type impurity are implanted into portions of the epitaxial layer 27 through the opening holes to form the base region 37 and the diffused resistance region 38. Thereafter, the resist 72 is removed.

Figure 19:
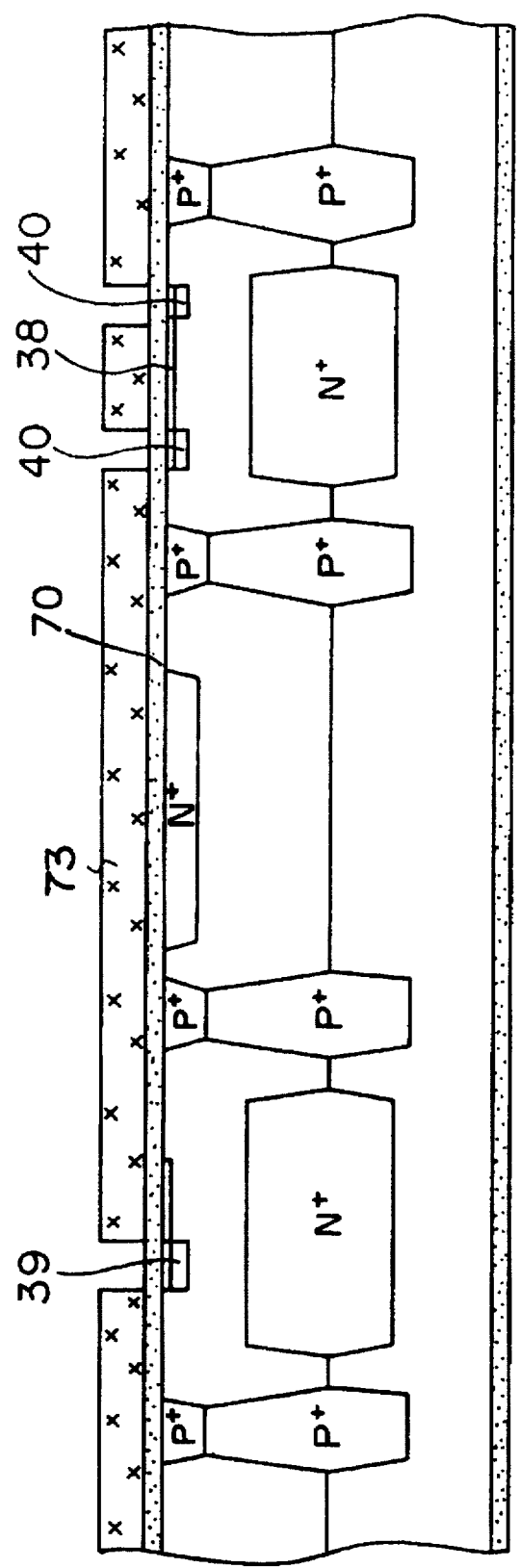
FIG. 19 is a fourth cross-sectional view showing the manufacturing method of the semiconductor integrated circuit apparatus according to the second embodiment of the present invention.

Thereafter, as shown in FIG. 19, a resist 73 is formed on the thinned oxidized film 70 and is patterned to expose portions of the thinned oxidized film 70 placed on a planned base contact region 39 and a pair of contact regions 40 of the diffused resistance region 38, and ions of a p type impurity are implanted into portions of the epitaxial layer 27 through the opening holes to form the base contact region 39 and the contact regions 40 of the diffused resistance region 38. Thereafter, the impurities implanted into the base region 37, the diffused resistance region 38, the base contact region 39 and the contact regions 40 of the diffused resistance region 38 are diffused. Thereafter, the resist 73 is removed.

Figure 20:
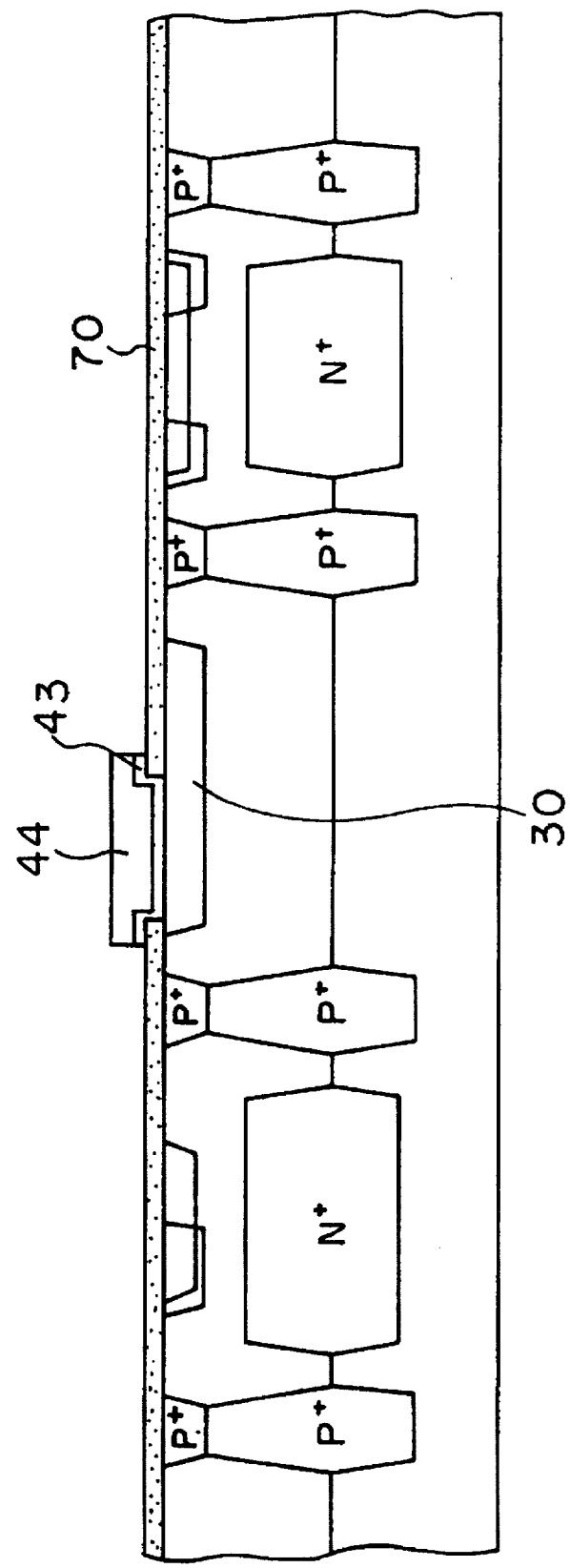
FIG. 20 is a fifth cross-sectional view showing the manufacturing method of the semiconductor integrated circuit apparatus according to the second embodiment of the present invention.

Thereafter, as shown in FIG. 20, a portion of the thinned oxidized film 70 placed on a planned lower layer diffusion region 30 is removed, and a silicon nitride film 43 and a poly-silicon film 44 are successively formed on the planned lower layer diffusion region (30) and the thinned oxidized film 70 in a non-oxygenic atmosphere according to low pressure chemical vapor deposition, and the silicon nitride film 43 and the poly-silicon film 44 are etched to form a patterned silicon nitride film 43 and a patterned poly-silicon film 44 placed on the planned lower layer diffusion region 30 and on a portion of the thinned oxidized film 70 surrounding the planned lower layer diffusion region 30.

Figure 21:
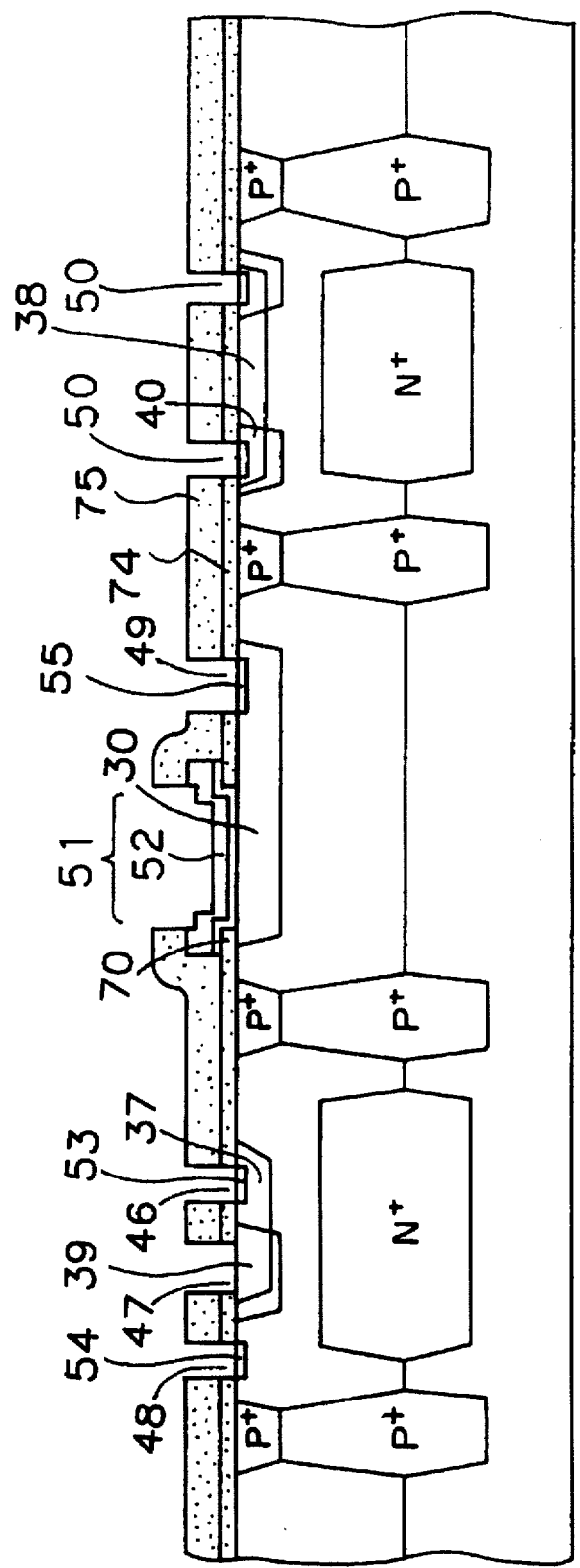
FIG. 21 is a sixth cross-sectional view showing the manufacturing method of the semiconductor integrated circuit apparatus according to the second embodiment of the present invention.

Thereafter, as shown in FIG. 21, a non-doped silicon oxidized film 74 and a phosphorous-doped silicon oxidized film 75 are formed all over the thinned oxidized film 70 and the patterned poly-silicon film 44, a thermal oxidation is performed for the non-doped silicon oxidized film 74 and the phosphorous-doped silicon oxidized film 75 to heighten the adhesion between the silicon oxidized film 75 and a resist, and a plurality of opening contact holes 46 to 51 are formed in the thinned oxidized film 70 and the silicon oxidized films 74 and 75. The contact hole 46 is placed on a planned emitter region positioned in a portion of the base region 37, the contact hole 47 is placed on a planned base contact region 39 positioned in another portion of the base region 37, the contact hole 48 is placed on a planned collector region 54 adjacent to the base region 37, the contact hole 49 is placed on a contact region 55 of the lower diffusion region 30, the contact holes 50 are placed on a pair of planned contact regions 40 of the diffused resistance region 38, and the contact hole 51 is placed in a planned position of an upper electrode of an MIS-type condenser. Also, the upper portion of the patterned poly-silicon film 44 is etched during the formation of the contact holes, and a thinned poly-silicon film 52 having a film thickness of about 1500 angstroms is formed.

The thermal oxidation for the patterned silicon nitride film 43 and the patterned poly-silicon film 44 is performed to prevent surfaces of the patterned silicon nitride film 43 and the patterned poly-silicon film 44 from being made rough in a dry etching process and heighten the adhesion between the patterned poly-silicon film 44 and a resist, as described above in the first embodiment.

Figure 22:
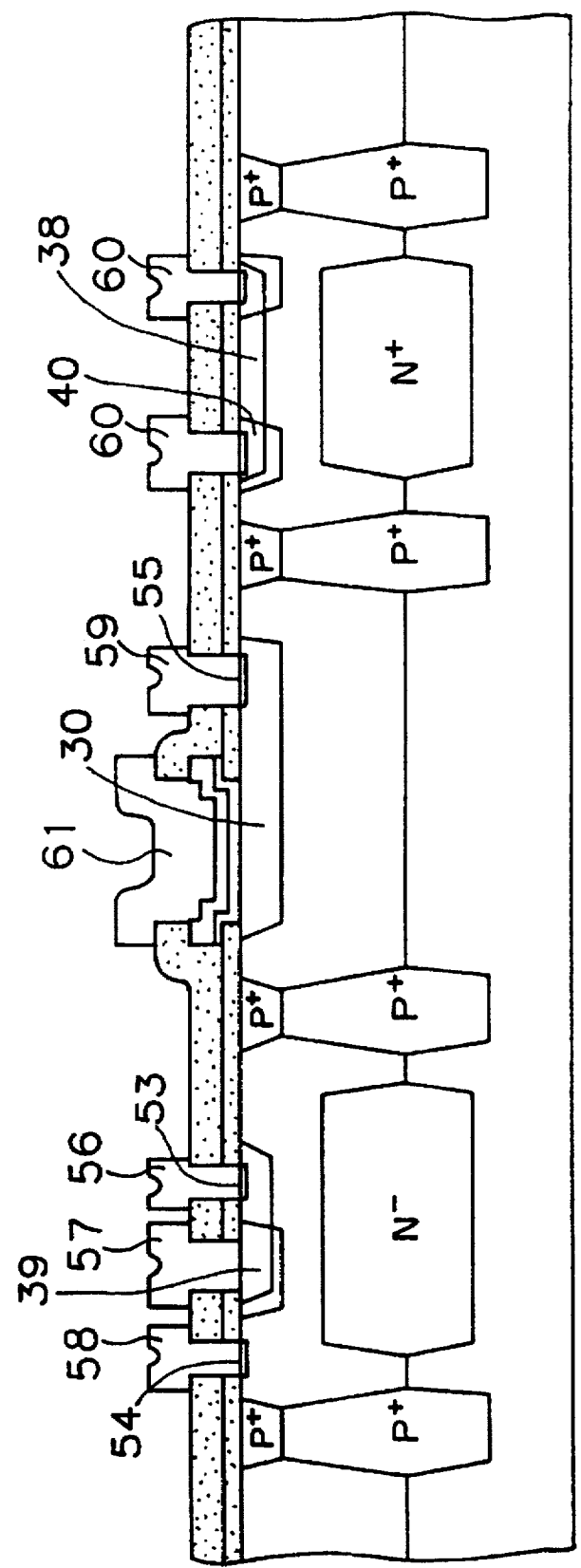
FIG. 22 is a seventh cross-sectional view showing the manufacturing method of the semiconductor integrated circuit apparatus according to the second embodiment of the present invention.

Thereafter, as shown in FIG. 22, ions of an n-type impurity are implanted into portions of the epitaxial layer 27 through the opening contact holes 46 to 50 (shown in FIG. 21) and are diffused to form the emitter region 53, the base contact region 39, the collector region 54, the contact region 55 of the lower diffusion region 30 and the contact regions 40 of the diffused resistance region 38, and the electrodes 56 to 61 are formed in the same manner as in the first embodiment.

As described above, to make a two-layered metal structure, the non-doped silicon oxidized film 74 and the phosphorous-doped silicon oxidized film 75 are formed, and the thermal operation is added. Because the silicon nitride film 43 and the poly-silicon film 44 are formed before the formation of the emitter 53 and the implantation and diffusion of the impurity are performed, a desired value of a grounded emitter forward current amplification factor $h_{FE}$ can be obtained while preventing the deterioration of the silicon nitride film 43.

What is claimed is:

1. A manufacturing method of a semiconductor integrated circuit apparatus including a metal-insulator-semiconductor-type condenser and a bipolar transistor, the method comprising:

preparing a semiconductor layer having a first region and a second region electrically separated from the first region;

forming a diffused layer as a lower layer electrode of the metal-insulator-semiconductor-type condenser in the upper portion of the second region of the semiconductor layer;

diffusing a first impurity in a first upper portion of the first region of the semiconductor layer to form a base region of the bipolar transistor in the first upper portion of the first region of the semiconductor layer;

forming a first insulating film on all of an upper surface of the semiconductor layer, the diffused layer and the base region;

forming a first opening in the first insulating film to expose a first portion of the diffused layer;

forming a silicon nitride film as a dielectric film of the metal-insulator-semiconductor-type condenser on the first insulating film and the first portion of the diffused layer;

forming a poly-silicon layer on the silicon nitride film after the formation of the silicon nitride film and before etching or oxidizing of said silicon nitride film;

patterning the silicon nitride film and the poly-silicon layer to leave the silicon nitride film and the poly-silicon layer remaining on the first portion of the diffused layer;

forming a second opening in the first insulating film to expose a first portion of the base region of the bipolar transistor;

forming a third opening in the first insulating film to expose a second portion of the base region of the bipolar transistor;

forming a fourth opening in the first insulating film to expose a second upper portion of the first region of the semiconductor layer;

forming a fifth opening in the first insulating film to expose a second portion of the diffused layer;

diffusing a second impurity into the second portion of the base region of the bipolar transistor to form an emitter region in the second portion of the base region;

diffusing the second impurity into the poly-silicon layer remaining on the first portion of the diffused layer so that the poly-silicon layer includes a conductive substance;

forming a base electrode on the first portion of the base region of the bipolar transistor;

forming an emitter electrode on the second portion of the base region of the bipolar transistor;

forming a collector electrode on the second upper portion of the first region of the semiconductor layer;

forming a lead electrode of the lower layer electrode of the metal-insulator-semiconductor-type condenser on the second portion of the diffused layer; and forming an upper electrode of the metal-insulator-semiconductor-type condenser on the portion of the poly-silicon layer including the conductive substance.

2. The manufacturing method of claim 1 wherein the forming of the poly-silicon layer includes:

depositing the poly-silicon layer on the silicon nitride film using chemical vapor deposition without exposing the silicon nitride film and the poly-silicon layer to oxygen in a chamber having the silicon nitride film formed therein.

3. The manufacturing method of claim 1 wherein each of the forming of the second opening, the forming of the third opening, the forming of the fourth opening and the forming of the fifth opening includes:

etching a portion of the first insulating film to form each of the second opening, the third opening, the fourth opening and the fifth opening; and etching the poly-silicon layer remaining on the diffused layer to form a thinner poly-silicon layer remaining on the first portion of the diffused layer.

4. The manufacturing method of claim 1 wherein each of the forming of the second opening, the forming of the third opening, the forming of the fourth opening and the forming of the fifth opening includes:

leaving the poly-silicon layer remaining on the first portion of the diffused layer after etching a portion of the first insulating film to form one of the second opening, the third opening, the fourth opening and the fifth opening.

5. The manufacturing method of claim 1, including:

forming a second insulating film on the first insulating film and the poly-silicon layer after patterning the silicon nitride film and the poly-silicon layer;

removing the second insulating film to leave a portion of the second insulating film remaining so that a portion of the poly-silicon layer remaining on the first portion of the diffused layer is exposed.

6. The manufacturing method of claim 5 wherein the removing of the second insulating film includes:

covering peripheries of the poly-silicon layer and the silicon nitride film with the portion of the second insulating film.

7. The manufacturing method of claim 1 wherein each of the forming of the second opening, the forming of the third opening, the forming of the fourth opening and the forming of the fifth opening includes:

forming the second opening, the third opening, the fourth opening and the fifth opening substantially simultaneously.

8. A manufacturing method of a semiconductor integrated circuit apparatus including a metal-insulator-semiconductor-type condenser and a bipolar transistor, the method comprising:

preparing a semiconductor layer having a first region and a second region electrically separated from the first region;

forming a diffused layer as a lower layer electrode of the metal-insulator-semiconductor-type condenser in the upper portion of the second region of the semiconductor layer;

diffusing a first impurity in a first upper portion of the first region of the semiconductor layer to form a base region of the bipolar transistor in the first upper portion of the first region of the semiconductor layer;

forming a first insulating film on all of an upper surface of the semiconductor layer, the diffused layer and the base region;

forming a first opening in the first insulating film to expose a first portion of the diffused layer;

forming a silicon nitride film as a dielectric film of the metal-insulator-semiconductor-type condenser on the first insulating film and the first portion of the diffused layer;

forming a poly-silicon layer on the silicon nitride film after the formation of the silicon nitride film;

patterning the silicon nitride film and the poly-silicon layer to leave the silicon nitride film and the poly-silicon layer remaining on the first portion of the diffused layer;

forming a second insulating film on the first insulating film and the poly-silicon layer;

removing the second insulating film to leave a portion of the second insulating film remaining so that a portion of the poly-silicon layer remaining on the first portion of the diffused layer is exposed;

forming a second opening in the first insulating film to expose a first portion of the base region of the bipolar transistor;

forming a third opening in the first insulating film to expose a second portion of the base region of the bipolar transistor;

forming a fourth opening in the first insulating film to expose a second upper portion of the first region of the semiconductor layer;

forming a fifth opening in the first insulating film to expose a second portion of the diffused layer;

diffusing a second impurity into the second portion of the base region of the bipolar transistor to form an emitter region in the second portion of the base region;

diffusing the second impurity into the poly-silicon layer remaining on the first portion of the diffused layer so that the poly-silicon layer includes a conductive substance;

forming a base electrode on the first portion of the base region of the bipolar transistor;

forming an emitter electrode on the second portion of the base region of the bipolar transistor;

forming a collector electrode on the second upper portion of the first region of the semiconductor layer;

forming a lead electrode of the lower layer electrode of the metal-insulator-semiconductor-type condenser on the second portion of the diffused layer; and forming an upper electrode of the metal-insulator-semiconductor-type condenser on the portion of the poly-silicon layer including the conductive substance, wherein each of the forming of the second opening, the forming of the third opening, the forming of the fourth opening and the forming of the fifth opening includes:

etching a portion of the first insulating film to form each of the second opening, the third opening, the fourth opening and the fifth opening;

etching the poly-silicon layer remaining on the diffused layer to form a thinned poly-silicon layer remaining on the first portion of the diffused layer and wherein the forming of the poly-silicon layer includes:

adjusting a film thickness of the poly-silicon layer to set a film thickness of the thinned poly-silicon layer in a range from about 1500 angstroms to about 2500 angstroms after the formation of the second opening, the third opening, the fourth opening and the fifth opening so that a voltage proof of the metal-insulator-semiconductor-type condenser is less than or equal to about 30 V.

* * * * *